(12) United States Patent
Röse et al.

(10) Patent No.: US 8,888,423 B2
(45) Date of Patent: Nov. 18, 2014

(54) ATTACHMENT STRUCTURE, ATTACHMENT DEVICE AND ATTACHMENT SYSTEM FOR ATTACHING AN EQUIPMENT COMPONENT IN AN AIRCRAFT

(75) Inventors: Frank Röse, Hamburg (DE); Thorsten Steinlicht, Buxtehude (DE); Rolf Gödecke, Hamburg (DE); Maxime Legrand, Hamburg (DE); Matthias Hartlef, Stade (DE)

(73) Assignee: Airbus Operations GmbH (DE)

( * ) Notice: Subject to any disclaimer, the term of this patent is extended or adjusted under 35 U.S.C. 154(b) by 595 days.

(21) Appl. No.: 13/125,431

(22) PCT Filed: Oct. 21, 2009

(86) PCT No.: PCT/EP2009/063774
§ 371 (c)(1),
(2), (4) Date: May 24, 2011

(87) PCT Pub. No.: WO2010/046376
PCT Pub. Date: Apr. 29, 2010

(65) Prior Publication Data
US 2011/0215203 A1 Sep. 8, 2011

Related U.S. Application Data

(60) Provisional application No. 61/196,853, filed on Oct. 21, 2008, provisional application No. 61/200,654, filed on Dec. 1, 2008.

(30) Foreign Application Priority Data

Oct. 21, 2008 (DE) .......................... 10 2008 052 519
Dec. 1, 2008 (DE) .......................... 10 2008 059 852

(51) Int. Cl.
*B60P 7/08* (2006.01)
*H05K 7/14* (2006.01)

(52) U.S. Cl.
CPC ..................... *H05K 7/1412* (2013.01)
USPC .......................................................... 410/81

(58) Field of Classification Search
USPC ................ 410/33, 35, 46, 76, 77, 80, 81, 91; 248/222.13, 222.41, 503; 244/118.1; 403/322.4
See application file for complete search history.

(56) References Cited

U.S. PATENT DOCUMENTS 3,991,968 A 11/1976 Yazejian
5,000,634 A * 3/1991 Ducote .......................... 410/77
(Continued)

FOREIGN PATENT DOCUMENTS

DE 4102274 C1 1/1992
DE 202006006168 U1 7/2006
(Continued)

*Primary Examiner* — Stephen Gordon
(74) *Attorney, Agent, or Firm* — Lerner, David, Littenberg, Krumholz & Mentlik, LLP

(57) ABSTRACT

An attachment device for attaching an equipment component in an aircraft, comprising a second attachment element for attaching an equipment component in an aircraft, the second attachment element comprising a guiding element, a contact element and a locking element, wherein the guiding element is introducible into a first section of a first attachment element, wherein the guiding element is movable from the first section of a first attachment element according to the present invention into a second section of the first attachment element, wherein the first attachment element and the second attachment element are mechanically couplable by engaging from behind the first attachment element in the second section of the first attachment element, wherein, in the coupled state, the contact element provides a mechanical contact between first and second attachment element and wherein by operating the locking element the first attachment element and the second attachment element are releasably fixable relative to one another.

8 Claims, 31 Drawing Sheets

(56) References Cited

U.S. PATENT DOCUMENTS

Figure 1:
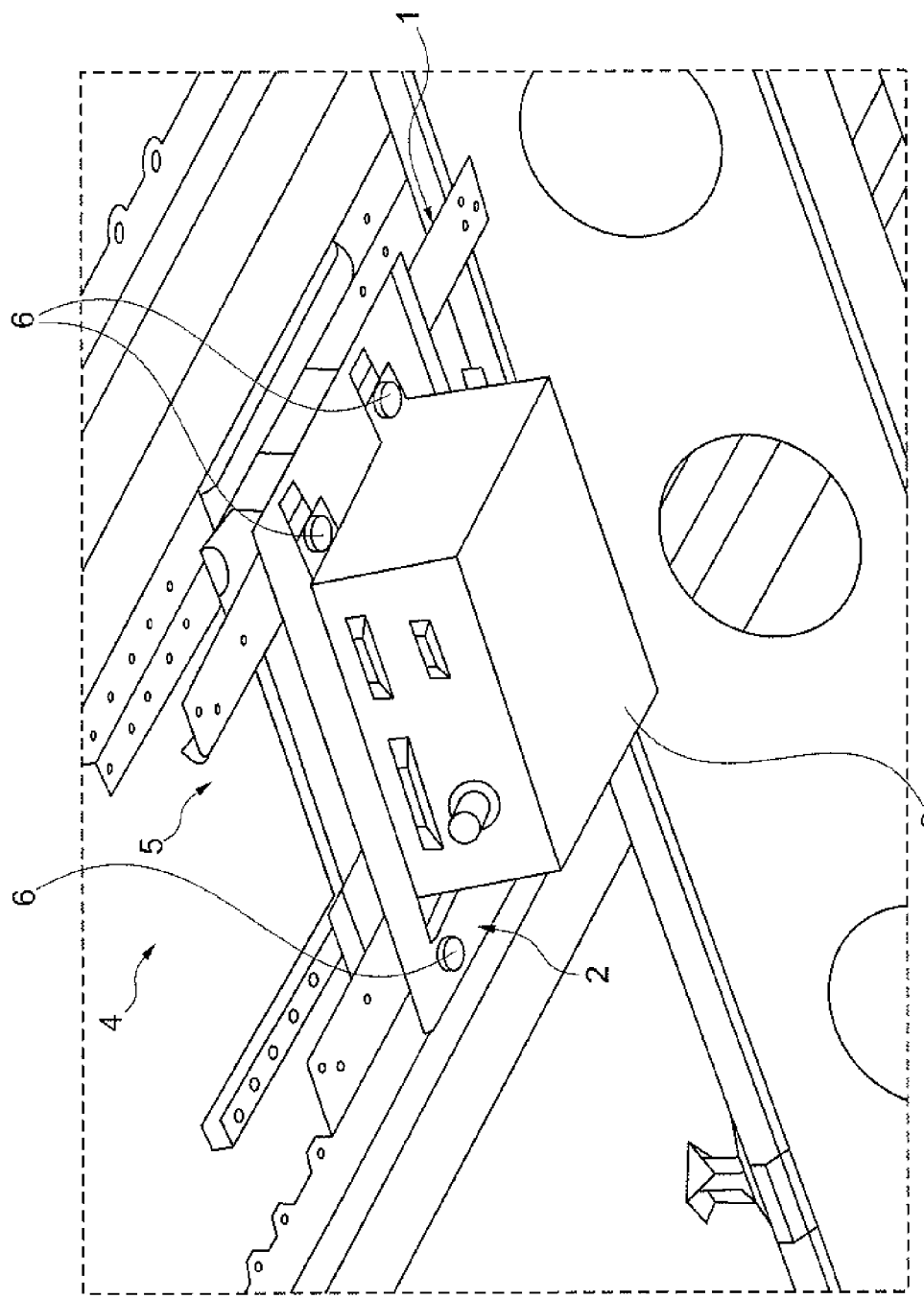

| | | | |
|---|---|---|---|
| 5,013,197 A * | 5/1991 | Allaert et al. | 410/77 |
| 5,234,297 A | 8/1993 | Wieck et al. | |
| 6,513,755 B1 | 2/2003 | Lambiaso | |
| 2003/0132346 A1 | 7/2003 | Lambiaso | |
| 2006/0054756 A1 | 3/2006 | Mons et al. | |
| 2008/0029667 A1 | 2/2008 | Schmitz | |
| 2008/0237440 A1 | 10/2008 | Lester et al. | |
| 2011/0006158 A1 | 1/2011 | Jager et al. | |

FOREIGN PATENT DOCUMENTS

| | | |
|---|---|---|
| DE | 102006036083 A1 | 2/2008 |
| DE | 202008001311 U1 | 5/2008 |
| DE | 102007030330 | 1/2009 |
| FR | 2849681 A1 | 7/2004 |
| GB | 364292 A | 1/1932 |
| GB | 861575 A | 2/1961 |
| GB | 2436971 A | 10/2007 |
| WO | 2008079181 A2 | 7/2008 |
| WO | 2009003763 | 1/2009 |

* cited by examiner

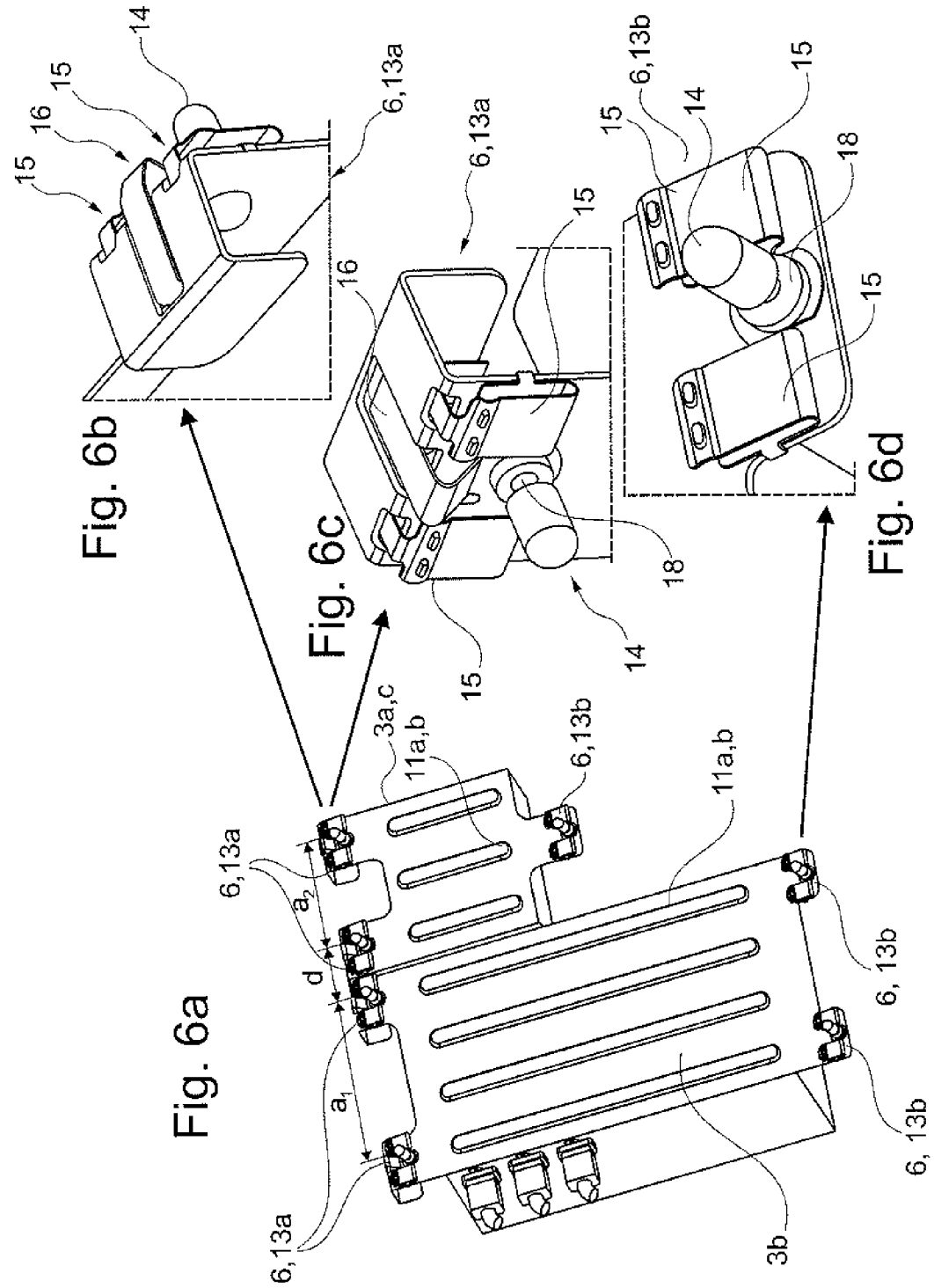

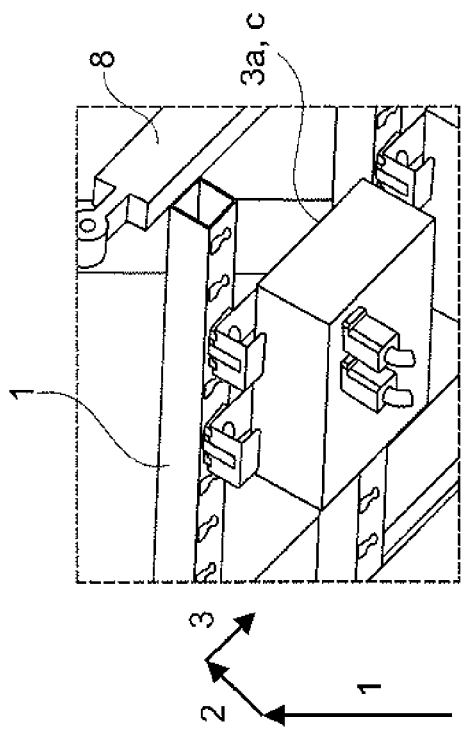
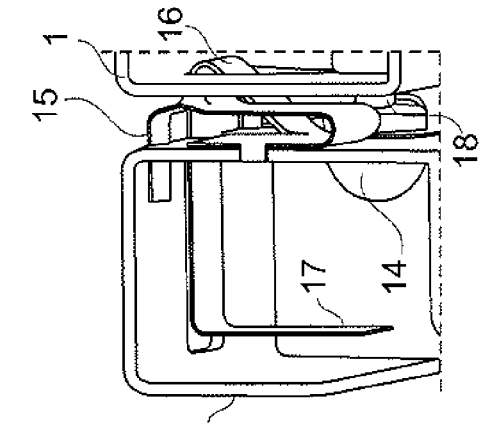
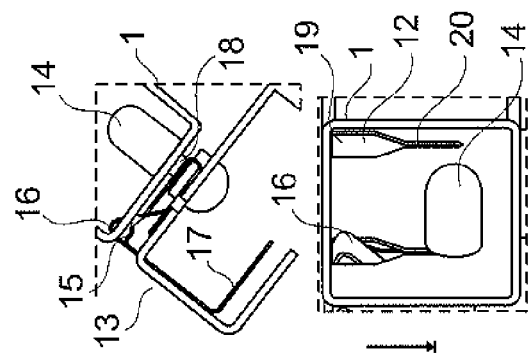
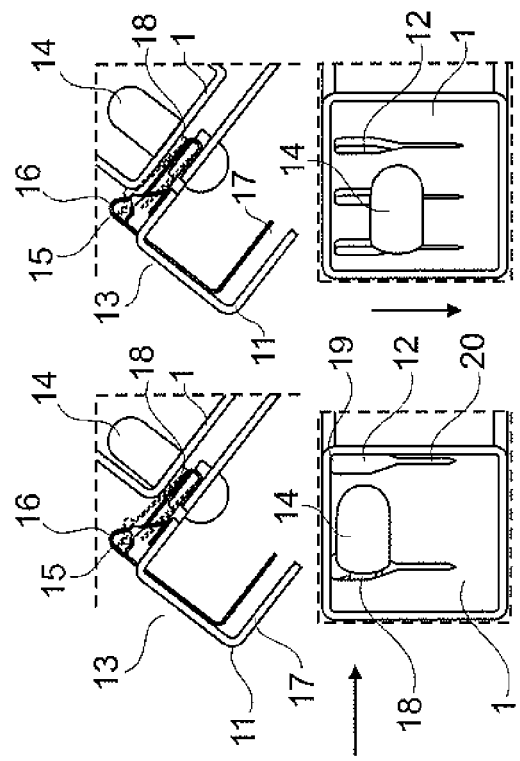
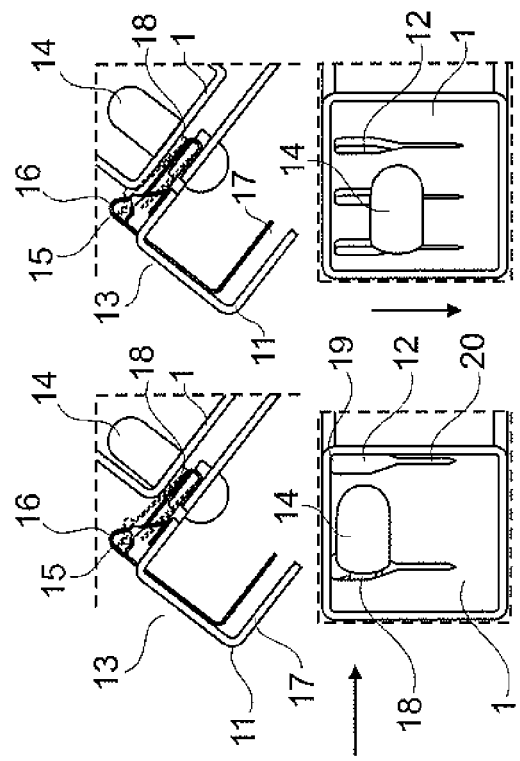

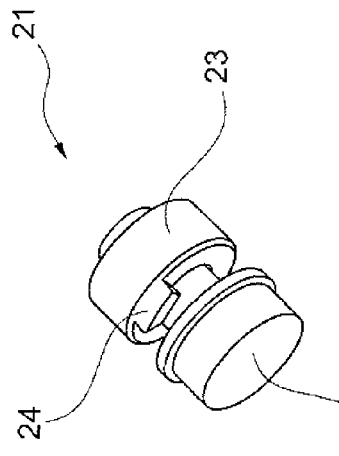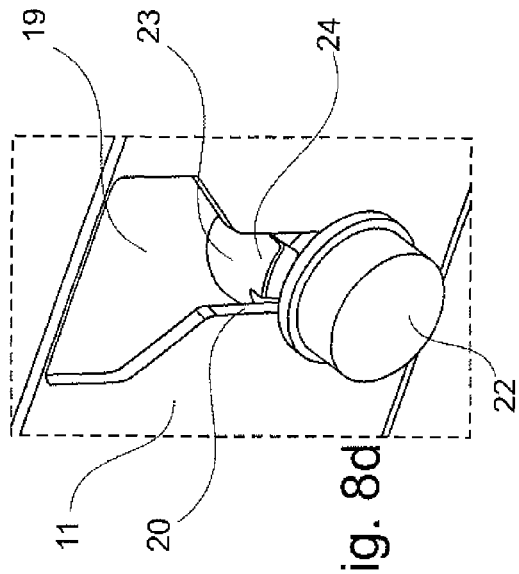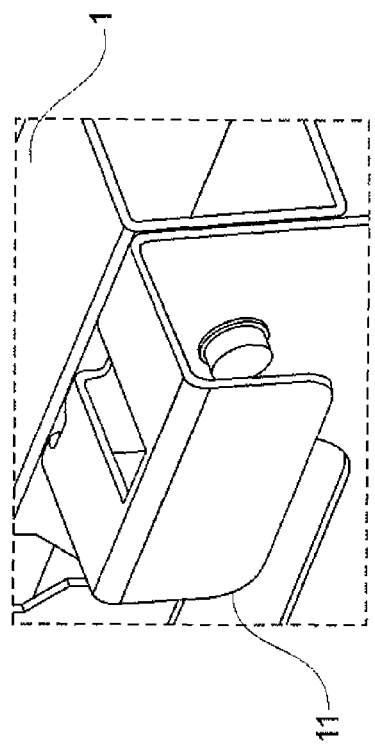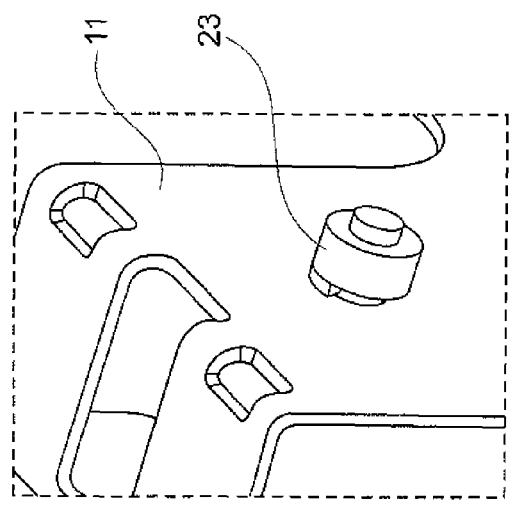

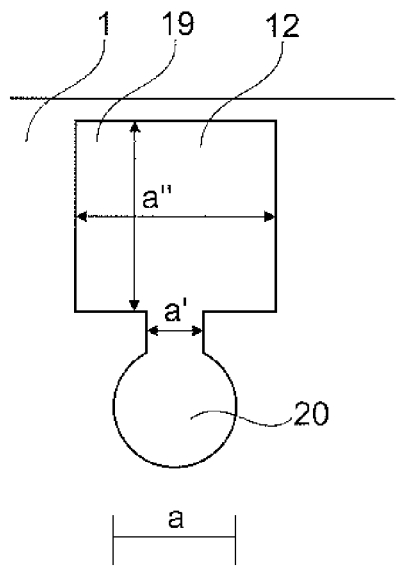
Fig. 17c
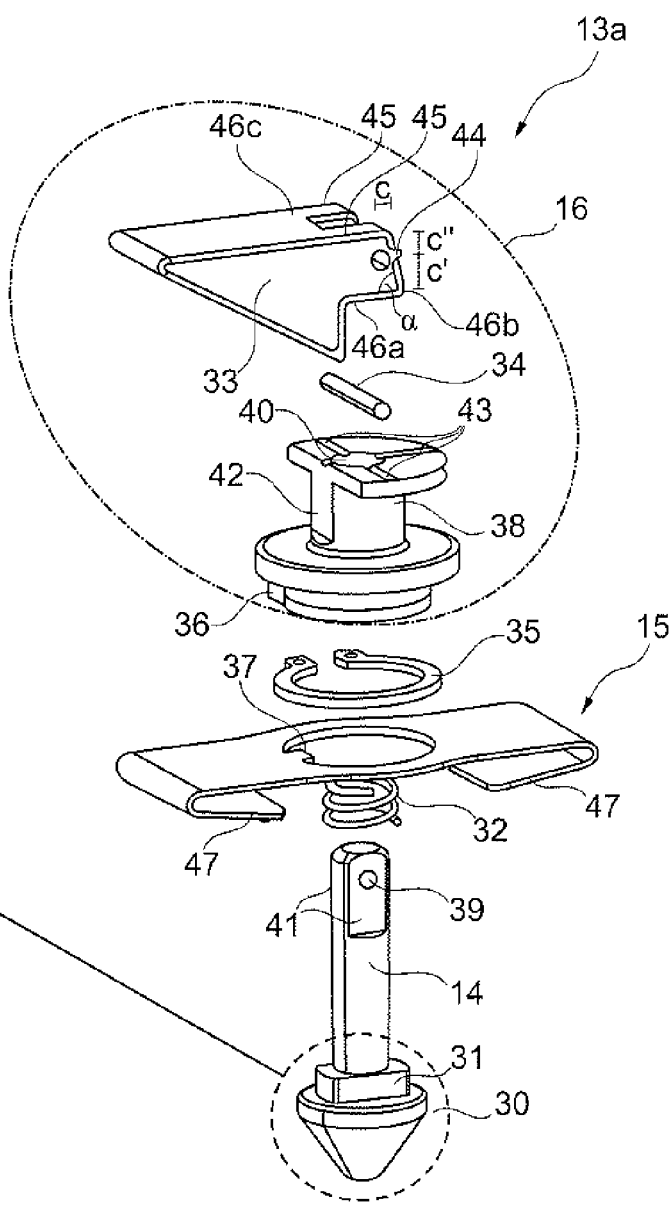
Fig. 17b
Fig. 17a

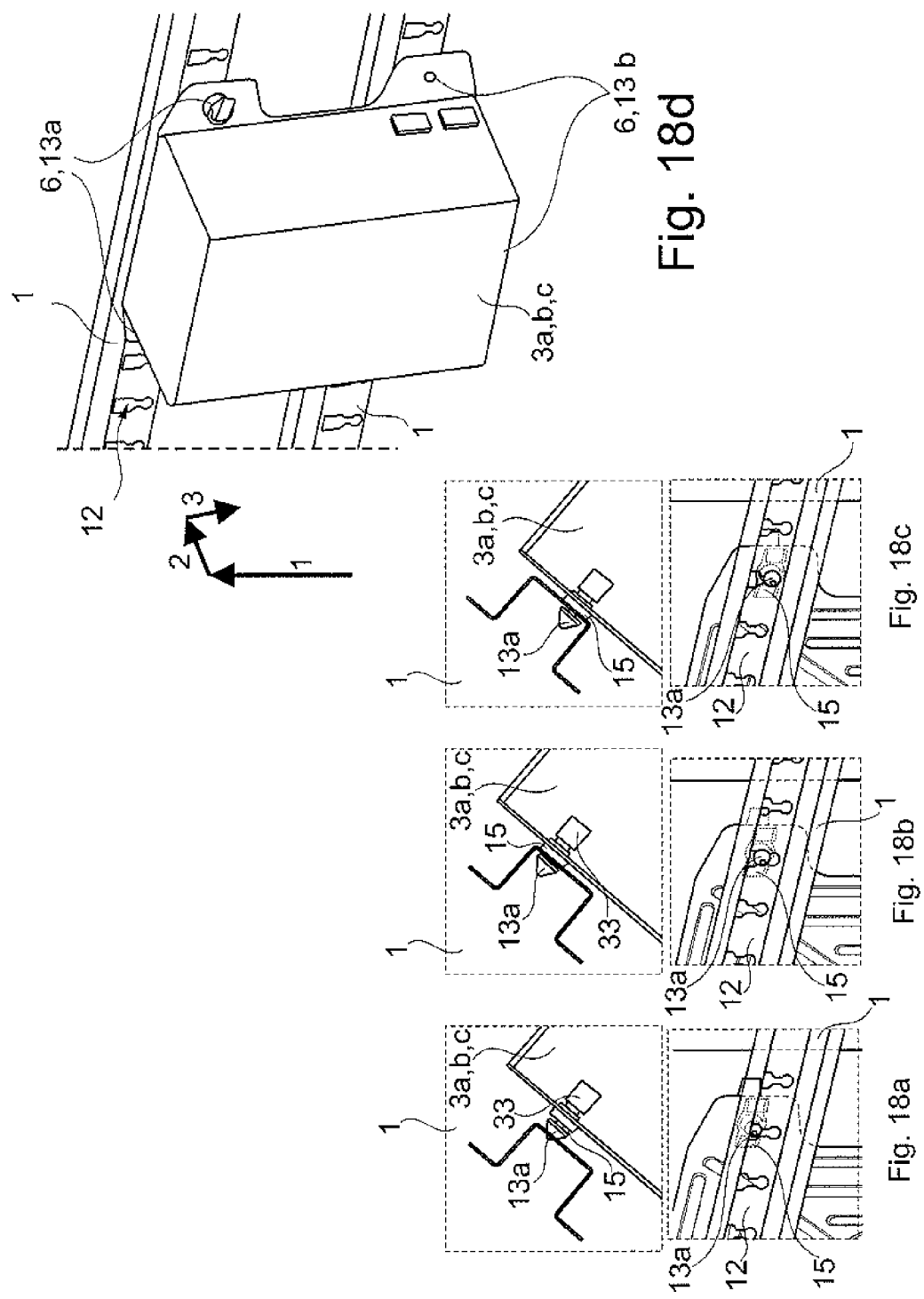

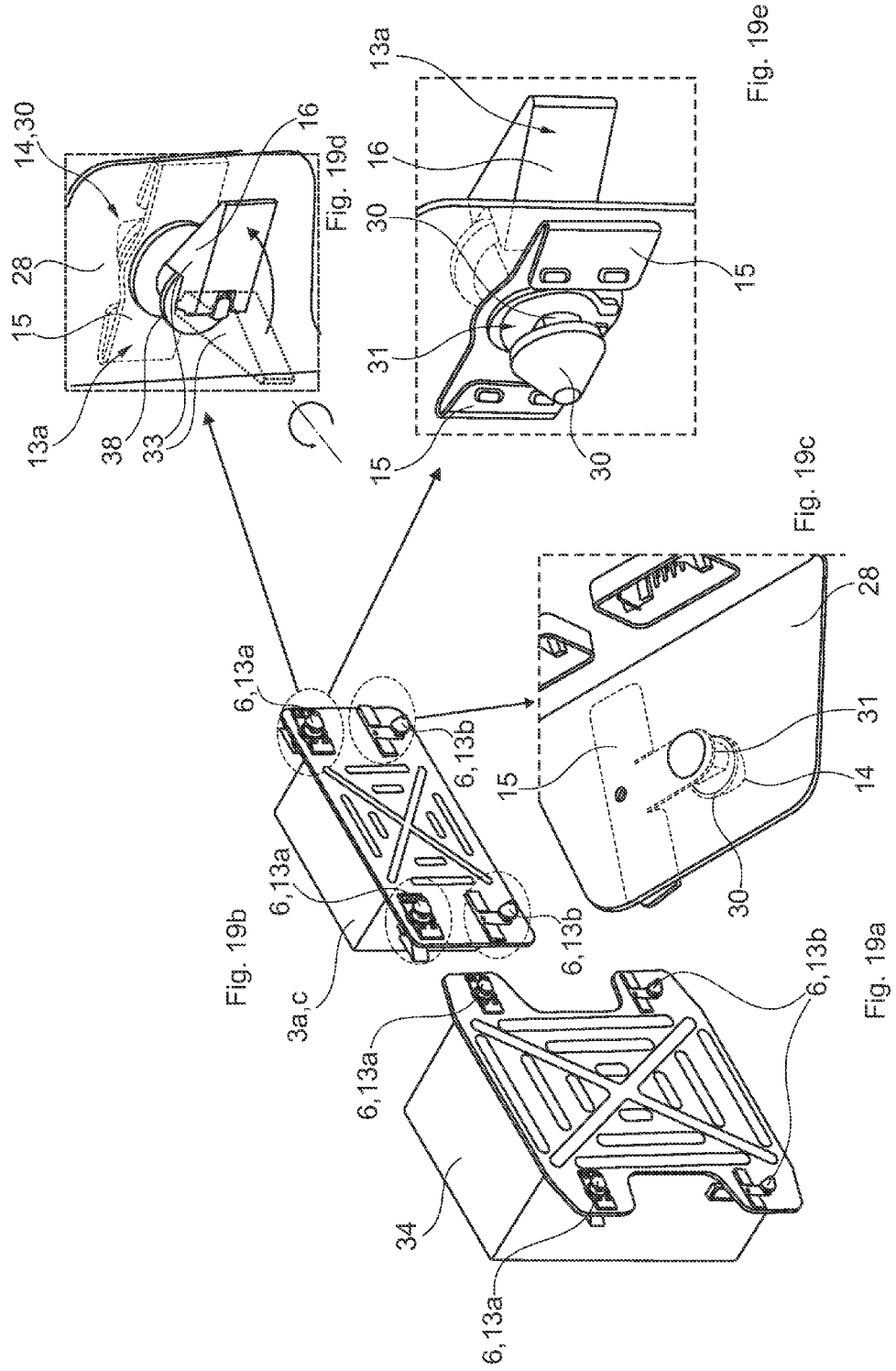

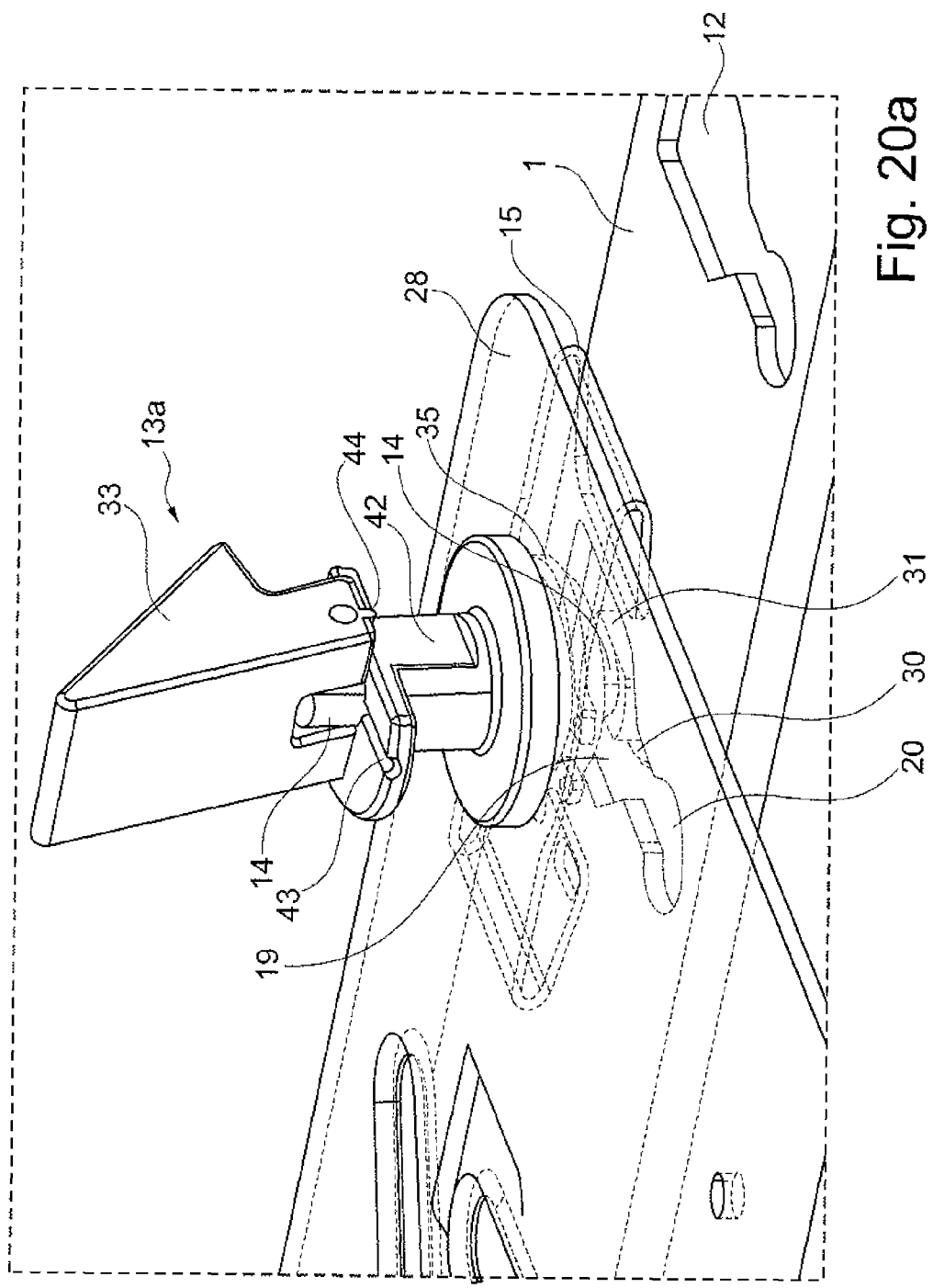

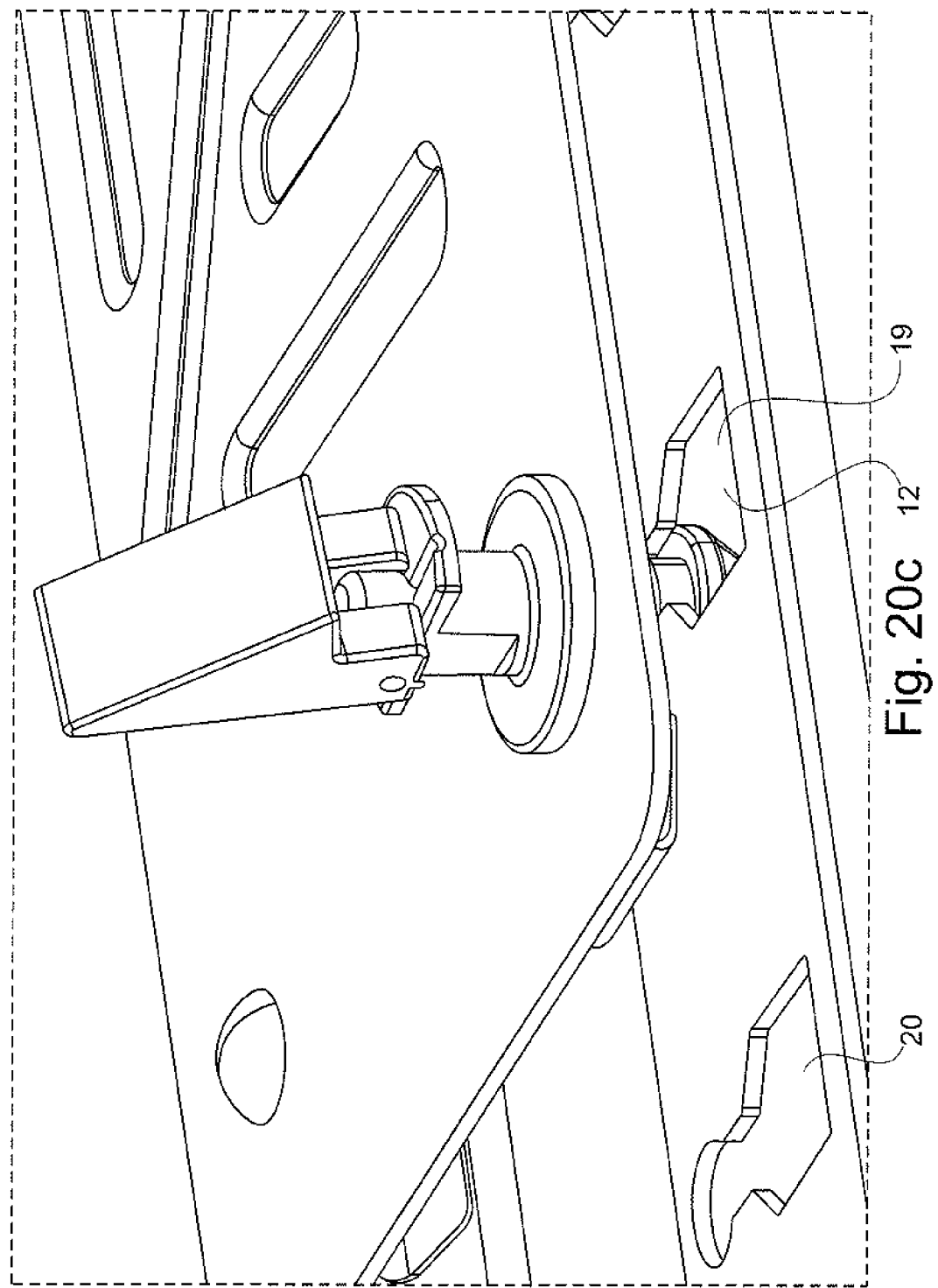

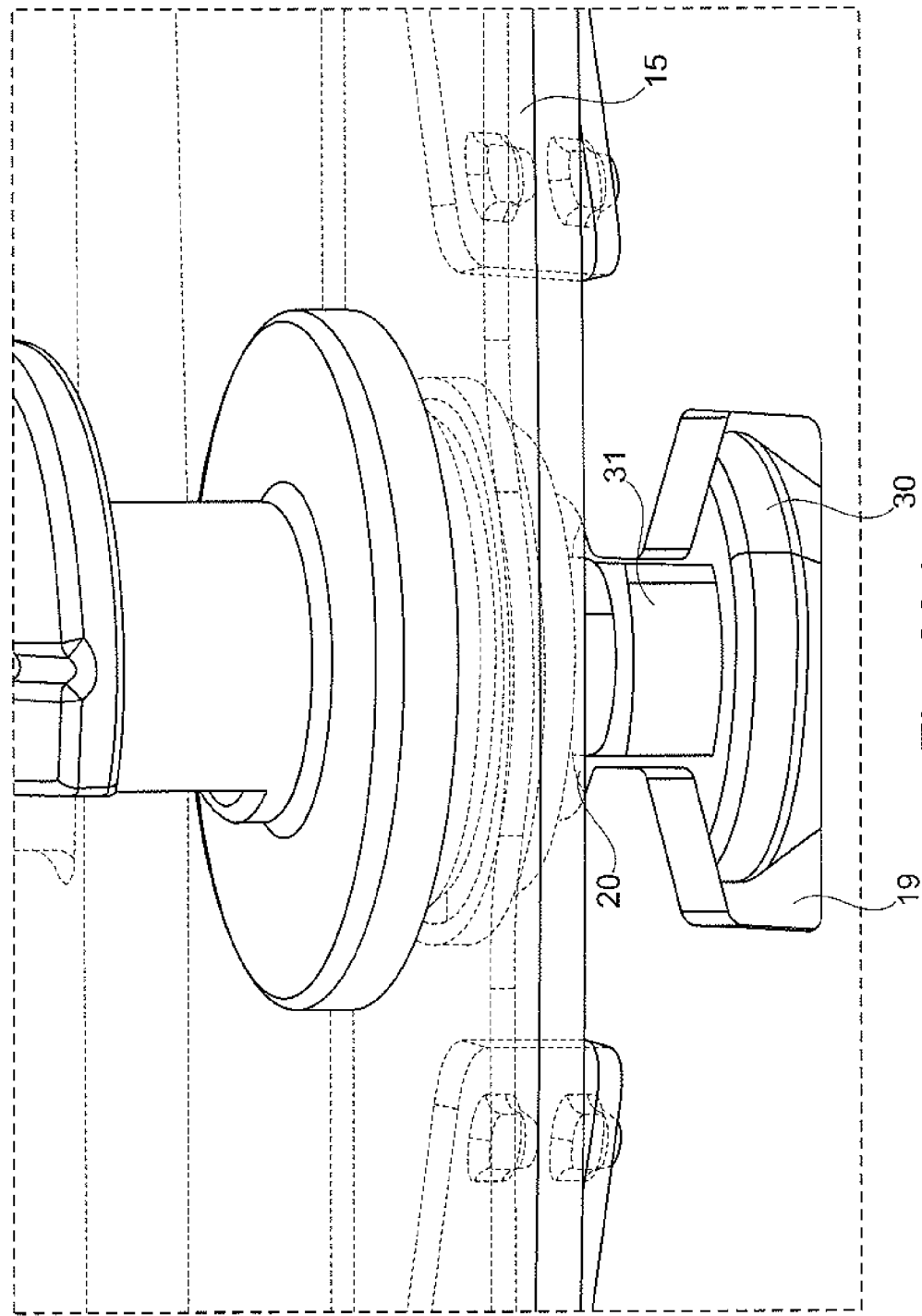

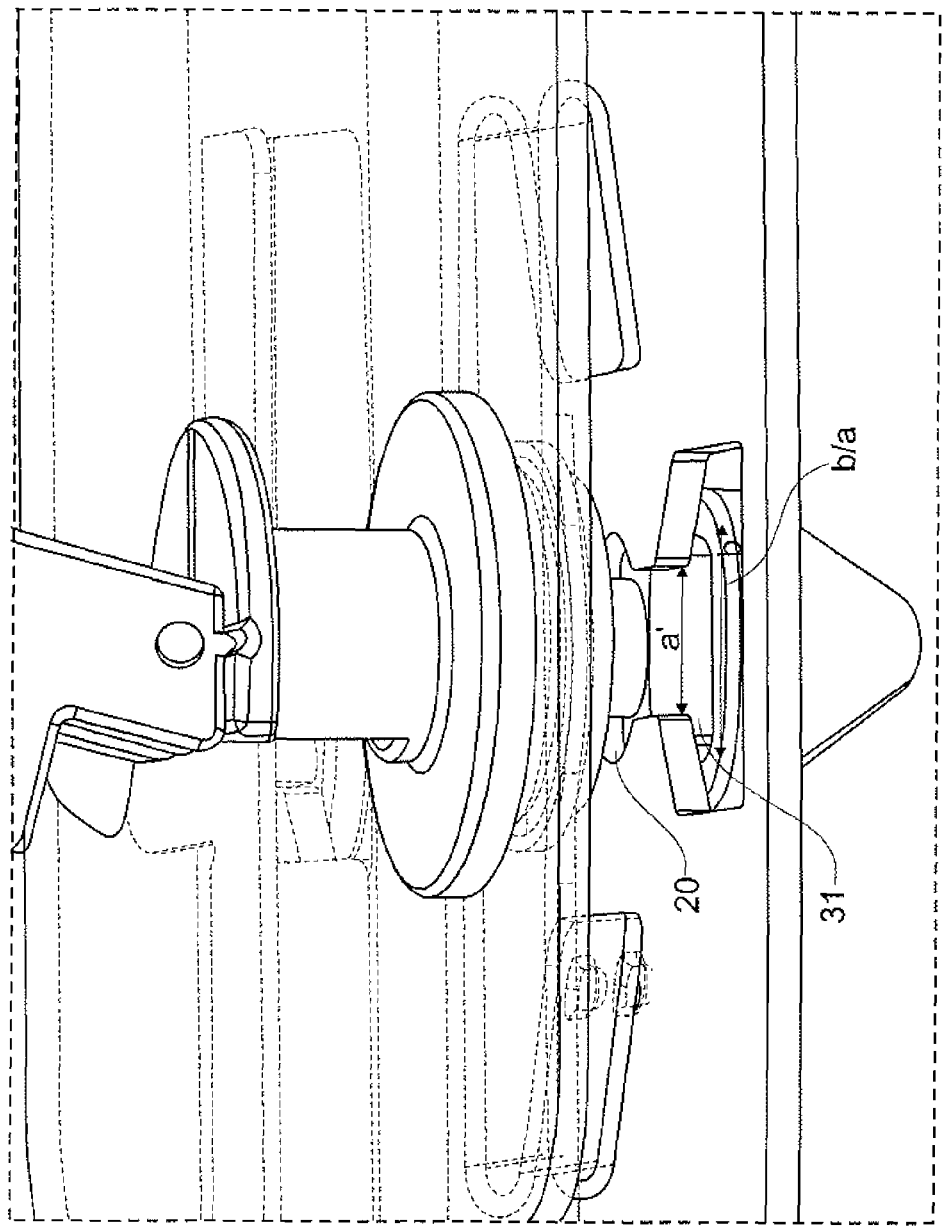

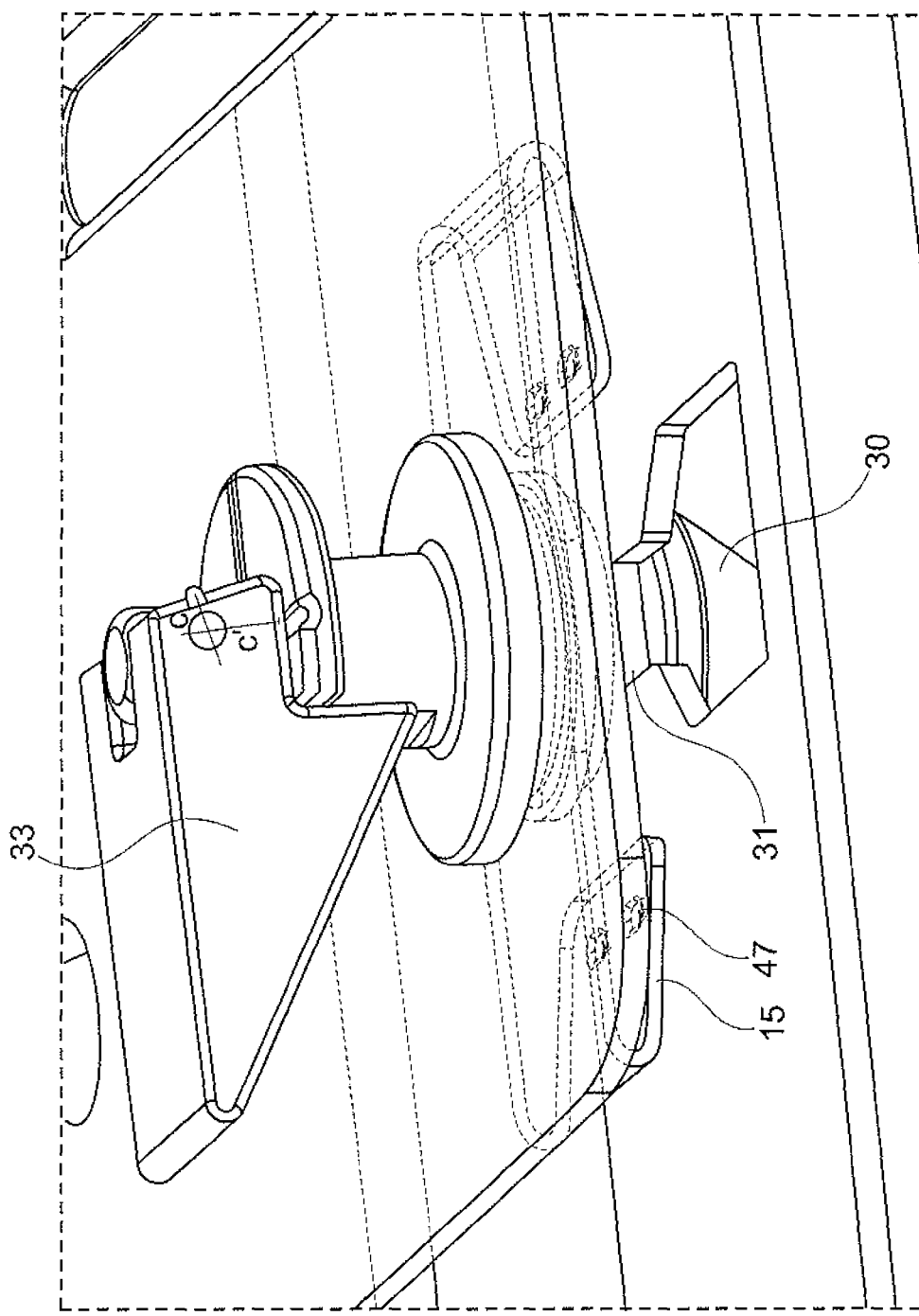

ATTACHMENT STRUCTURE, ATTACHMENT DEVICE AND ATTACHMENT SYSTEM FOR ATTACHING AN EQUIPMENT COMPONENT IN AN AIRCRAFT

CROSS-REFERENCE TO RELATED APPLICATIONS

This application is a national phase entry under 35 U.S.C. §371 of International Application No. PCT/EP2009/063774, filed Oct. 21, 2009, published in German, which claims the benefit of the filing date of German Patent Application No. 10 2008 052 519.7, filed Oct. 21, 2008, U.S. Provisional Patent Application No. 61/196,853, filed Oct. 21, 2008, German Patent Application No. 10 2008 059 852.6, filed Dec. 1, 2008, and U.S. Provisional Patent Application No. 61/200,654, filed Dec. 1, 2008, the entire disclosures of which are hereby incorporated herein by reference.

The invention relates to an attachment structure, an attachment device, an attachment system, an equipment component according to the present invention, an aircraft comprising an attachment structure according to the present invention, an attachment device according to the present invention, an attachment system according to the present invention and/or an equipment component according to the present invention as well as the use of an attachment structure according to the present invention, an attachment device according to the present invention, an attachment system according to the present invention and/or an equipment component according to the present invention in an aircraft.

Common attachment systems allow the attachment of e.g. a component in the interior of an aircraft or at a part of the aircraft structure.

Known attachment systems however are often adapted individually to the attachment location and/or to the component to be attached in other words are embodied specific to a high degree. Further, the attaching and releasing of a component in the area of aircraft technology often is complicated and/or requires a substantive amount of time due to significant security requirements, so that a quick, ad hoc or flexible mounting, dismounting and/or changing of a component is not feasible.

Document DE 10 2007 030 330 and PCT/EP 2008/056275 describe a tiltable equipment carrier in combination with a modified luggage storage for an aircraft.

Document U.S. Pat. No. 6,513,755 describes a tiltable component carrier and a method for installing of component carriers in an aircraft.

One aspect of the present invention is to provide an efficient attachment system, which allows a flexible and quick attaching/mounting and releasing of a component in an aircraft and additionally complies with relevant security requirements in the area of aircraft technology.

This need may be met by an attachment structure, an attachment device, an attachment system, an equipment component according to the present invention, an aircraft comprising an equipment structure according to the present invention, an attachment device according to the present invention, an attachment system according to the present invention and/or an equipment component according to the present invention as well as the use of an attachment structure according to the present invention, an attachment device according to the present invention, an attachment system according to the present invention and/or an equipment component according to the present invention in an aircraft according to the independent claims.

According to an exemplary embodiment of the present invention, an attachment structure for attaching an equipment component in an aircraft is provided, comprising a first attachment element comprising an opening, the opening comprising a first section and a second section, wherein the first section is adapted so that a guiding element of an attachment device according to present invention is introducible, wherein the second section is adapted to be positively engageable with a second attachment element and wherein a mechanical contact between the first and the second attachment element may be provided in a coupled state by employing a contact element of the second attachment element.

According to a further exemplary embodiment of the present invention, an attachment device for attaching an equipment component in an aircraft is provided, comprising a second attachment element for attaching an equipment component in an aircraft, the second attachment element comprising a guiding element comprising a connecting element, a contact element and a locking element, wherein the guiding element is introducible into a first section of a first attachment element according to the present invention, wherein the guiding element is introducible/movable from the first section into a second section of the first attachment element, wherein the first attachment element and the second attachment element may be mechanically couplable by engaging from behind the first attachment element in the second section of the first attachment element, wherein the contact element provides a mechanical contact between the first and the second attachment element in a coupled state and wherein by operating/engaging/activating the locking element the first attachment element and the second attachment element are releasably couplable/fixable/engageable relative to one another.

According to a further exemplary embodiment of the present invention, an attachment system for attaching an equipment component in an aircraft is provided, comprising an attachment structure according the present invention, wherein the attachment structure is mountable to the structure of an aircraft, and an attachment device according to the present invention, wherein the guiding element is introducible/movable from a first section of the first attachment element into a second section of the first attachment element, wherein the first attachment element and the second attachment element are mechanically couplable, by engaging from behind the first attachment element, in the second section of the first attachment element, wherein the contact element provides a mechanical contact between the first and the second attachment element in a coupled state and wherein by operating the locking element, the first attachment element and the second attachment element are releasably fixable relative to one another.

According to a further aspect of the present invention an attachment structure for attaching an equipment component in an aircraft is provided, comprising a first attachment element comprising an opening, the opening comprising a first section and a second section, wherein the first section is adapted so that a connecting element of an attachment device according to the present invention is introducible, wherein the second section is adapted to the positively engageable with the connecting element of the second attachment element and wherein a mechanical contact between the first and the second attachment element may be provided in a coupled state by employing a contact element of the second attachment element.

According to a further aspect of the present invention, an attachment device for attaching an equipment component in an aircraft is provided, comprising a second attachment element for attaching an equipment component in an aircraft, the second attachment element comprising a guiding element comprising a connecting element, a contact element and a locking element, wherein the connecting element is introducible in a first section of a first attachment element according to the present invention, wherein the guiding element is movable from the first section into the second section of the first attachment element, wherein the first attachment element and the second attachment element may be mechanically couplable, by engaging from behind of the first attachment element, by employing the connecting element in the second section of the first attachment element, wherein the contact element provides a mechanical contact between the first and the second attachment element in a coupled state, wherein by operating the locking element, the first attachment element and the second attachment element are releasably fixable relative to one another.

According to a further aspect of the present invention, an attachment system for attaching an equipment component in an aircraft is provided, comprising an attachment structure according to the present invention, wherein the attachment structure may be attached to the structure of an aircraft, and an attachment device according to the present invention, wherein a guiding element is movable from a first section of the first attachment element into a second section of the first attachment element, wherein the first attachment element and the second attachment element are mechanically couplable, by engaging from behind of the first attachment element, by employing the connecting element in the second section of the first attachment element, wherein the contact element provides a mechanical contact between the first and the second attachment element in a coupled state and wherein by operating the locking element, the first attachment element and the second attachment element are releasably fixable relative to one another.

According to a further aspect of the present invention, an attachment structure for attaching an equipment component in an aircraft is provided, comprising a first attachment element comprising an opening, the opening comprising a first section with a first extension and a second section with a second extension, wherein the first extension is larger than the second extension, wherein the first section is adapted such that a guiding element of an attachment device according to the present invention is introducible in the first section and wherein the second section is adapted to engage in a recess of the guiding element of the second attachment element for providing a mechanically coupled state/mechanical coupling between the first and the second attachment element, wherein a contact element of the second attachment element provides a mechanical contact between the first and the second attachment element in a coupled state, wherein a locking element of the second attachment element, in a coupled state, engages in the first section of the opening and wherein by engaging of the locking element of the second attachment element in the first section, the attachment structure and the attachment device are fixable relative to one another.

According to a further aspect of the present invention, an attachment device for attaching an equipment component in an aircraft is provided, comprising a second attachment element for attaching an equipment component in an aircraft, the second attachment element comprising a guiding element, a contact element and a locking element, wherein the guiding element comprises a recess, wherein the guiding element, by employing the recess, is movable from a first section of a first attachment element according to the present invention into a second section of the first attachment element, wherein the first attachment element and the second attachment element, by introducing the recess of the guiding element in the second section of the first attachment element, may be provided in a mechanically coupled state, wherein the contact element, in the coupled state, provides a mechanical contact between the first and the second attachment element, wherein the locking element, in the coupled state, engages with the first section of the opening, and wherein by engaging of the locking element in the first section, the first attachment element and the second attachment element are fixable relative to one another.

According to a further aspect of the present invention, an attachment system for attaching an equipment component in an aircraft is provided, comprising an attachment structure according to the present invention, wherein the attachment structure is attachable to the structure of an aircraft, and an attachment device according to the present invention, wherein the first attachment element and the second attachment element by introducing the recess of the guiding element in the second section of the first attachment element are mechanically couplable, wherein the contact element provides a mechanical contact between the first and the second attachment element in the coupled state, wherein the locking element engages with the first section of the opening in the coupled state, and wherein by engaging of the locking element in the first section, the first attachment element and the second attachment element are fixable relative to one another.

According to a further aspect of the present invention, an equipment component for an aircraft is provided, comprising at least one attachment device according to the present invention.

According to a further aspect of the present invention, an aircraft is provided, comprising an attachment structure according to the present invention for attaching an equipment component, an attachment device according to the present invention for attaching an equipment component, an attachment system according to the present invention for attaching an equipment component and/or an equipment component for an aircraft according to the present invention.

According to further aspect of the present invention, an attachment structure according to the present invention for attaching an equipment component, an attachment device for attaching an equipment component according to the present invention, an attachment system for attaching an equipment component according to the present invention and/or an equipment component according to the present invention in an aircraft is provided.

The present invention relates to a mounting or attachment concept for components in an aircraft.

The components may be attached to an attachment structure, for example a rail system. The attachment structure may run in x-direction, thus, in longitudinal direction through the aircraft and may thus extend substantially over the full length of the aircraft. A further, arbitrary orientation in an aircraft is equally conceivable.

The attachment structure may provide defined attachment points or attachment spots, which are arranged spaced apart from one another in a defined grid for allowing a flexible mounting or attaching of components.

The individual components may comprise standardized dimensions, the size may thus be preset. The attachment structure comprises, along its extension, a plurality of first attachment elements, wherein the plurality of first attachment elements may be arranged in a defined repeating manner.

The components on the other hand comprise at least one second attachment element, which is engageable with the first attachment element to thus allow a mechanically stable connection or mounting of the component with/to the attachment structure.

By standardizing and in particular by an integration or an integral embodiment of the second attachment element with the component, the component may be mountable to the attachment structure and thus to the aircraft in a flexible manner without necessary mechanical adaptation, e.g. by employing an adapter plate.

The components may thus be attached to an attachment structure. The attachment structure itself may be embodied as a rail structure, in particular as a plurality of rails, which are attached to the aircraft structure in parallel and in a defined distance from one another.

By integration of a carrier element into the housing of a component, a weight load and the weight may be reduced, respectively. On the one hand, a separate adapter plate may thus be conceived as being omitted, on the other hand, a housing basis plate may be understood as a carrier element according to the present invention, which may provide the functionality of an adapter plate.

At the component and the carrier element/at the basis plate, respectively, the second attachment element may be attached to, e.g. a protrusion or a flap/ear.

E.g., for standardization, defined component dimensions may be defined or preset, which are adapted to the attachment structure and the plurality of first attachment elements, respectively. The dimension of a component may also define the distance of the rails to one another.

The manufacturer of a component may, depending on the required dimensions, may choose a defined, standardized component cross-section and a component length. By the standardization, the component manufacturer may provide the component housing in a weight optimized manner.

The components may be attached to the attachment structure by different means. Accordingly, the components may either be screwed on/to/into or they may be mountable by a "snap and click" process (plug and play). With both methods, a solely mechanical mounting or also a mechanical and at the same time electrical connection may be realized.

For realizing an electrical connection, the components and/or the attachment structure/rails may be embodied at least partially conductive or coated. Thereby, for example a short circuit current of a component in case of a fault may be conducted away and/or an earth connection may be realized.

In case of the "screwed" embodiment, the screw connection may be realized as a blind screw connection, which may in particular be advantageous for an application scenario in which the rearward area of the attachment structure is not accessible or access is constricted.

An electrical connection may be realized by the screwing on or screwing together of coated parts of the component and the attachment structure, which, e.g. in a partial region, for example in the thread of a screw connection and/or in a region of the component may be embodied conductively, e.g. by removal of a non-conductive coating. Further, an electrical connection may be provided by a conductive element, e.g. a dedicated earth strap.

For the attachment of a component in an aircraft it may e.g. preferably be required to provide a connection, which is as secure and as much free of play as possible.

Occurring vibrations, e.g. in case a substantially metallic component is attached to a substantially metallic attachment structure, and the noise exposure resulting from minor vibrations are displeasing for passengers as well as members of a crew in an aircraft and may be prevented as best as possible.

Furthermore, a component attached in an aircraft shall at best be attached, so that an accidental releasing, thus the slipping of the component out of its mounting, is avoided.

Accordingly, an attachment of a component in an aircraft may on the one hand provide a certain flexibility or absorption to avoid noise emissions, while at the same time the component may be attachable to the aircraft structure by a single or double positive locking.

An attachment device or an attachment element according to the present invention may thus comprise a positive locking element, which on the one hand provides a simple, targeted mounting, while simultaneously and/or additionally comprising spring elements for minimizing occurring vibrations and noise emissions resulting therefrom.

In particular preferable may be an attachment device, which comprises a positive locking element, which is alterable between an insertion state in which the positive locking is substantially removed and a locking state, in which a connection to the aircraft structure is rendered possible in a positive locking and vibration free manner.

To satisfy extended security requirements in an aircraft, a locking means or mechanism is to be provided, which effectively prevents the accidental removal of the positive locking, thus the shifting of the positive locking element from a locked, positive locking state to an unlocked, open state.

A first attachment element according to the present invention may likewise be understood as an opening or may coincide in its functionality and in its embodiment with said opening.

Further exemplarily, the second attachment element may be realized as a bolt-spring variant or element, taking in conjunction with an opening in the first attachment element (e.g. in the form of a keyhole).

In this regard, the second attachment element may be embodied as a fast locking system employing the "snap and click" principle, wherein also an automatic grounding may be provided.

The snap and click principle may be realized by employing a second attachment element, which comprises a guiding element, a contact element and a locking element.

Guiding element, contact element and/or locking element, thus bolt and/or spring may be attached to the component or a carrier element thereof. The opening or the keyhole may be provided at the first attachment element, at the attachment structure or rail. Said openings or keyholes may comprise a defined distance from each other.

The opening or the keyhole may comprise a variable opening cross-section, which is e.g. tapered or narrowed at one side/end. Furthermore, the guiding element of the second locking element or the bolt may comprise a tapering, a recess or a gap, which is adapted in its dimensions to the opening, e.g. to realize a mechanical connection in the tapered region.

Thus, the component may be introduced with the guiding element into an opening of the first attachment element. By a shift of the component and thus of the guiding element in the opening, the recess of the guiding element may engage with the tapered opening for so realizing a mechanical connection. The rail with its wall thickness may thus engage with the recess of the bolt (key and slot principle).

Contact elements of the second attachment element may rest against or on the first attachment element and may thus provide an electrical contact. In this regard, the contact elements may be embodied as spring elements to ensure a contact, which is substantially free of play, even when subjected to a minor mechanical load, thus a movement, e.g. by vibration.

The locking element, for example a locking spring, may engage or snap into the opening or the keyhole in an end position of the component and may thus secure/safeguard a mechanical connection. The component may be attached mechanically and may comprise an electrically conductive connection, e.g. a ground connection. The locking element may engage in the opening and may prevent or block a shifting or pushing back, against the insertion direction or shifting direction.

By the locking of the component, by employing the locking spring in the opening of the first attachment element, an arbitrary alignment of the opening or the keyhole may be conceivable. Thus, the extension and thus the movement of the component, from the insertion of the guiding element in the opening up to the locking of the locking element may be parallel or also perpendicular to the extension direction of the attachment structure.

Further, additionally attachment structures or rails may be provided along the extension direction of the attachment structure, e.g. for realizing the mounting of devices or components with differing standard dimensions. Accordingly, e.g. a component having a first standard dimension or also a plurality of components having a second standard dimension, which e.g. is smaller than the first, may be attached to the identical or similar position by employing further attachment structures or rails.

Multiple components may thus be mountable in parallel, slightly shifted adjacent to each other or on top of/above each other, wherein the individual components may be geared with each other by employing a so-called crown profile. Thus, multiple components may be mountable, independent of their lengths or quantity, on above each other or next to each other.

The second attachment element or the attachment device and the attachment structure may provide a spring mounted mechanical and electrical connection while at the same time having an integrated attachment and locking mechanism.

The opening of the first attachment element may comprise a first section with a first extension as well as a second section with a second extension. The first extension may be larger than the second extension. The guiding element may further comprise a recess, wherein the first attachment element and the second attachment element are fixable to one another by introducing the recess of the guiding element into the second section of the opening.

The guiding element may comprise a first dimension, which is smaller than the opening in its first section, however larger than the opening in its second section, whereas a recess of the guiding element is smaller than the opening in its second section. Thus, the guiding element, with its recess, may be introducible into the second section and may provide a mechanical contact between the guiding element and the second section of the opening, thus between the second attachment element and the first attachment element, e.g. by a section of the guiding element in front of and behind of the recess.

The opening may be tapered from the first section to the second section, e.g. non-linearly and/or linearly. The second section may thus be smaller than the outer dimensions of the guiding element, but at least equally large or larger than the dimensions of the recess of the guiding element.

The first attachment element or the guiding element may be introduced in the first attachment element in the region of the first section of the opening, may be shifted in the direction of the second section, wherein the guiding element, with the recess, may engage in the second section of the opening, for providing a mechanical and/or electrical connection.

Furthermore, a standardization of the equipment component may be realized by defining, exemplary, two preset dimensions or cross-sections, which may be mountable/pluggable to the attachment structure in a defined grid pattern. This dimension or this grid pattern may define the distance of the attachment structures to one another.

A manufacturer of an equipment component may choose a preferred housing dimension and/or length from a standardized specification of the equipment component, depending on a size or space requirement of an equipment component and/or a circuit board. Accordingly a fast mounting of the equipment components may be realized and in particular a facilitated serviceability by reducing the time required for removing and mounting.

Furthermore, it may be unnecessary to provide earth straps, since earth connections may be realized by e.g. the attachment elements. By the standardization or the standardized dimensions of the equipment components, a weight reduction may result, due to adapter plates being omitted.

Furthermore, a preferred sequence of the equipment components may be realized by the preset grid pattern. By saved material as well as by standardized dimensions, an equipment component may be manufactured economically, in particular also by an optimized choice of dimension of a housing of the equipment component.

Thus, equipment components may be strung together to attachment structures in a defined grid pattern. A standardized size of a housing or standardized device housings of equipment components with an integrated basis plate or carrier element may comprise the attachment and contacting system, thus the attachment device or the second attachment element according to the present invention.

At the housing sites or elements one or more connectors may be provided, e.g. SAC1 or SAC3 type connectors of company Tyco.

An attachment system according to the present invention allows to simultaneously provide a mechanical mounting as well as an electrically conductive connection. Adapter plates may be omitted for the installation or the mounting of equipment components.

Further exemplary embodiments of the present invention are provided by the dependent claims.

In the following, embodiments of the attachment structure for attaching an equipment component in an aircraft according to the present invention are described. These explanations also apply to the attachment device for attaching an equipment component in an aircraft, to the attachment system for attaching an equipment component in an aircraft, to an equipment component in an aircraft, to an aircraft comprising an attachment structure according to the present invention, an attachment device according to the present invention, an attachment system according to the present invention and/or an equipment component according to the present invention as well as the use of an attachment structure according to the present invention, an attachment device according to the present invention, an attachment system according to the present invention and/or an equipment component according to the present invention in an aircraft.

When, in the following, a section or the shape of a section is described, the shape of the opening shall thereby be understood. In particular, the shape of the opening in the respective section shall thereby be understood.

According to a further exemplary embodiment of the present invention, the opening in the area of the second section may be embodied, at least in sections or at least in parts thereof, in the shape of a circle and/or may be embodied as a tapering between the first and the second section.

A section embodied, at least in parts or in sections, circularly, may, together with the connecting element or a suitably formed positive locking element part of the connecting element, which is also at least in sections circularly shaped, allow a connection of first and second attachment element substantially free of play. By introducing the part of the connecting element, which is at least in sections circular, into a second section, which is at least in parts or in sections circular, with e.g. a subsequent turning of the connecting element part may said part be positioned in the second section, so that a substantially positive locking connection may be provided.

For subsequently ensuring, that a positive locking may be realizable, there may be provided a tapering between the second section and the first section. In this context, a tapering may be understood as a transition of the first and second section or a region between the first and second section, which comprises dimensions, which e.g. are less than the diameter of the, at least in parts, circular part of the second section.

Thereby, an at least partly shifting or slipping of the connecting element and thus the second attachment element out of the first attachment element may be avoidable. First and second section may substantially directly pass over into one another or a further section may be arranged between the first and second section, e.g. a section with constant width (an opening with constant width).

According to a further exemplary embodiment of the present invention the attachment structure may comprise a plurality of first attachment elements, wherein the plurality of first attachment elements are arranged in a defined repeating manner.

Thus, the position or the mounting of a second attachment element or an equipment component may be flexibly adaptable to a desired or required mounting location.

The defined repeating manner may e.g. be understood as a defined distance between the attachment elements or their openings or may be understood as e.g. a repetition of a group of openings, which are arranged in a defined manner.

The defined repeating arrangement of the plurality of first attachment elements thus provides a grid pattern for the defined mounting of equipment components.

Differing, defined presets and/or standardized dimensions of equipment components may be adapted to the defined repeating arrangement such that a flexible arrangement or mounting of equipment components may be realized.

According to a further exemplary embodiment of the present invention, the attachment structure may be embodied as a structure out of the group consisting of a rail structure, perforated rail, U-rail. Z-rail, Ω-rail, inverse Ω-rail and rectangular rail.

A rail structure may in particular allow, in an easy manner, to attach an attachment structure to the aircraft structure, to thereby allow a secure mechanical coupling of equipment components to the aircraft structure by the second attachment element.

Accordingly, a rail structure may e.g. be attached to the aircraft structure by comparatively few mounting points, in particular with less mounting points than would be required by a plurality of first attachment elements.

In this regard, the profile of the respective rail is indicated by the respective letter or by the respective denomination.

In particular, an Ω-rail may provide a preferred means to realize an attachment, since in this regard, two parallel attachment structures are arranged at one and the same rail and may thus be attached to the aircraft structure conjointly.

The respective rail profile may, in each case, comprise first attachment elements on that part of its structure, which, in each case, is symbolized by the upper or the lower crosswise lying end of the respective letter. The intermediate elements of the respective letter, for the most part arranged upright or diagonal/circular-shaped, may symbolize the respective coupling of the individual rail elements to one another as well as the attachment possibility to the aircraft structure or to a V-bracket.

In the following, embodiments of the attachment device according to the present invention for attaching an equipment component in an aircraft are described. These explanations also apply to the attachment structure for attaching an equipment component in an aircraft, for the attachment system for attaching an equipment component in an aircraft, for an equipment component in an aircraft, for an aircraft comprising an attachment structure according to the present invention, an attachment device according to the present invention, an attachment system according to the present invention and/or an equipment component according to the present invention for an aircraft as well as for the use of an attachment structure according to the present invention, an attachment device according to the present invention, an attachment system according to the present invention and/or an equipment component according to the present invention in an aircraft.

According to a further exemplary embodiment of the present invention, the attachment device may comprise a continuation of the locking elements, wherein by operating the continuation of the locking element, the engaging of the locking element in the first section is releasable.

By the engaging of the locking element in the first section of the first attachment element, the second attachment element may be securely mechanically couplable with the first attachment element or may be connectable to the same. The locking element may provide a safeguarding of the guiding element versus a shifting in the opening, thus against an unintentional releasing of first and second attachment element.

By releasably engaging of the locking element by operating the continuation of the locking element, an in turn desired or required releasing of first and second attachment element may be realizable.

By operating the continuation of the locking element, the same may be moved out of the first section, which in turn allows the guiding element to shift or slip in the opening from the second section in the direction of the first section. Thereby, by operating the continuation of the locking element, the substantially complete mechanical coupling of first as well as second attachment element may be releasable.

According to a further exemplary embodiment of the present invention, the attachment device or the second attachment element may be embodied as a blind screw connection.

A blind screw connection may in particular allow to provide a locking or a screwing of for example an equipment component to the first attachment element or to an attachment structure or rail, which substantially provides access only to one side, e.g. the front side.

A blind screw connection may be embodied as a screw with associated nut, which is introduced into the opening of the first attachment element from one side and, for example, locks an equipment component to the first attachment element.

The nut of the blind screw connection may be provided self-locking or self-inhibiting so that the nut is not moved uniformly with the screw, when turning the screw, so that a mechanical coupling or screw connection of first and second attachment element and thus of equipment components and attachment structure is realized.

In the following, embodiments of the attachment system according to the present invention are described. These explanations also apply likewise for the attachment structure for attaching an equipment component in an aircraft, for an attachment device for attaching an equipment component in an aircraft, for an equipment component for an aircraft, for an aircraft comprising an attachment structure according to the present invention, an attachment device according to the present invention, an attachment system according to the present invention and/or an equipment component according to the present invention as well as for the use of an attachment structure according to the present invention, an attachment device according to the present invention, an attachment system according to the present invention and/or an equipment component in an aircraft according to the present invention.

According to a further exemplary embodiment of the present invention, the first attachment element and the second attachment element may be electrically conductively connected in the coupled state.

Thus in the following, the component may be electrically conductively connectable with the attachment structure and in the following with the aircraft structure, e.g. for a global earth connection of the component to the aircraft structure.

One or more elements of the group consisting of guiding element, contact element, locking element, conductive element, first attachment element, second attachment element, attachment structure, attachment system, attachment device, aircraft structure and/or equipment component may be understood as elements of the conductive connection.

A conductive element may in particular be a separate element, which may specifically realize a conductive connection between the first attachment element and the second attachment element or between an equipment component and an attachment structure. The conductive element may e.g. be a cable connection or also a flexible band, for example an earth strap made of a metal.

A conductive connection may be provided by coating of individual elements. A coating may e.g. be embodied comprising nickel, or one or more elements may be adapted as a conductive material, e.g. metal.

The contact element or a further element may e.g. provide an action of force in the locked state, so that the first attachment element and the second attachment element, even when subjected to a mechanical load, e.g. by vibration, are kept in permanent contact, thereby securing a conductive connection.

According to a further exemplary embodiment of the present invention, the attachment system may further comprise a component or an equipment component comprising a carrier element, wherein the second attachment element is arranged at the carrier element and wherein the component is attachable, in particular removably attachable, to the attachment structure by employing the second attachment element.

Thus, an equipment component may be attachable to the attachment structure and thus subsequently to the aircraft structure in an easy and comfortable manner.

The equipment component may comprise standardized dimensions and may be individually placed and/or aligned in the attachment structure due to the plurality of first attachment elements.

Equipment components having differing sizes or differing standard dimensions may likewise be aligned and mounted individually to one another.

According to a further exemplary embodiment of the present invention, the carrier element may be embodied as an integral part of the component.

Thus, a weight reduction may be realizable by avoiding a separate carrier element, which is possibly mounted between the housing of a component and an attachment structure. A separate carrier element may also be understood as an adapter element, which would be adapted to realize an adaptation of a non-standardized housing to the standardized mounting dimensions of the attachment structure in conjunction with the attachment device in the attachment system.

A standardized embodiment of the equipment component may adapt the equipment component to the standardized dimensions of an attachment structure in such a way so as to avoid a separate carrier element/adapter element.

By a carrier element being an integral part of an equipment component, which may thus comply with standardized dimensions, a separate carrier element may be considered to be superfluous.

Thus, a weight reduction may be realized by avoiding a separate carrier element, which possibly would be arranged between the housing of a component or equipment component and the attachment structure.

The carrier element may be part of the housing of the component, e.g. bottom, top or side element of the housing. Elements of the component, e.g. a printed circuit board (PCB), may be mounted directly to the carrier element.

According to a further exemplary embodiment of the present invention, the attachment system may further comprise at least one further attachment structure, wherein the at least one further attachment structure is arranged in a defined distance to the attachment structure and wherein the carrier element further comprises a plurality of second attachment elements, wherein the second attachment elements are arranged at the carrier element so that the component is mountable or removably fixable by employing at least two attachment structures.

Thus, the component may be attached to one or a plurality of attachment structures with at least two further attachment elements. In particular, at least three second attachment elements may provide a substantially structurally defined, fixed and secure mounting of a component to the attachment structures.

A plurality of attachment structures arranged in parallel, e.g. three parallel attachment structures, allow for example the mounting of a first component with first dimensions to two outer attachment structures of the three parallel attachment structures, wherein, exemplary, two second components with second dimensions, which second dimensions e.g. may be smaller than the first dimension, may be attached adjacent to each other each time between one of the outer attachment structures and the center attachment structure of the at least three parallel attachment structures.

Thereby (standardized) components may be comfortably and flexibly, individually attachable to the attachment means.

According to a further exemplary embodiment of the present invention, the component and the attachment structure, in the coupled state, may be automatically locked and/or the component and the attachment structure, in the coupled state, may be connected automatically electrically conductably.

Accordingly, a simple mechanical and/or electrical connection of the component to the attachment structure and thus to the aircraft structure may be realized.

The component may further be removable from the attachment structure in a simple and comfortable manner. By the mounting while at the same time providing an electrically conductive connection, in particular installation or deinstallation complexity/time may be reduced significantly.

In this context, automatically may be understood such that the mechanical coupling or locking and/or the electrical connection may be realized or released without a separate work burden, in particular while performing the transition/moving of the component from first to second section or vice versa.

Accordingly, the component may be locked when being inserted into the second section without further manual action e.g. by engaging of the locking element in the first section and/or at the same time the electrically conductive connection between first and attachment element and thus between equipment component and attachment structure, may be realized by bringing in contact of guiding element, contact element and/or locking element with the first attachment element or with the attachment structure.

In the following, exemplary embodiments of the preset invention are depicted in the figures and will subsequently be further explained.

Identical or similar components in different figures are referred to with identical reference numerals.

The illustration of the figures is schematic and not drawn to scale, however may depict qualitative proportions.

The invention is not restricted in its scope to the embodiments depicted in the figures. Rather, a plurality of variants are conceivable, which employ the solution provided and the technical concept depicted though employing substantially different embodiments.

It shows

Figure 2:
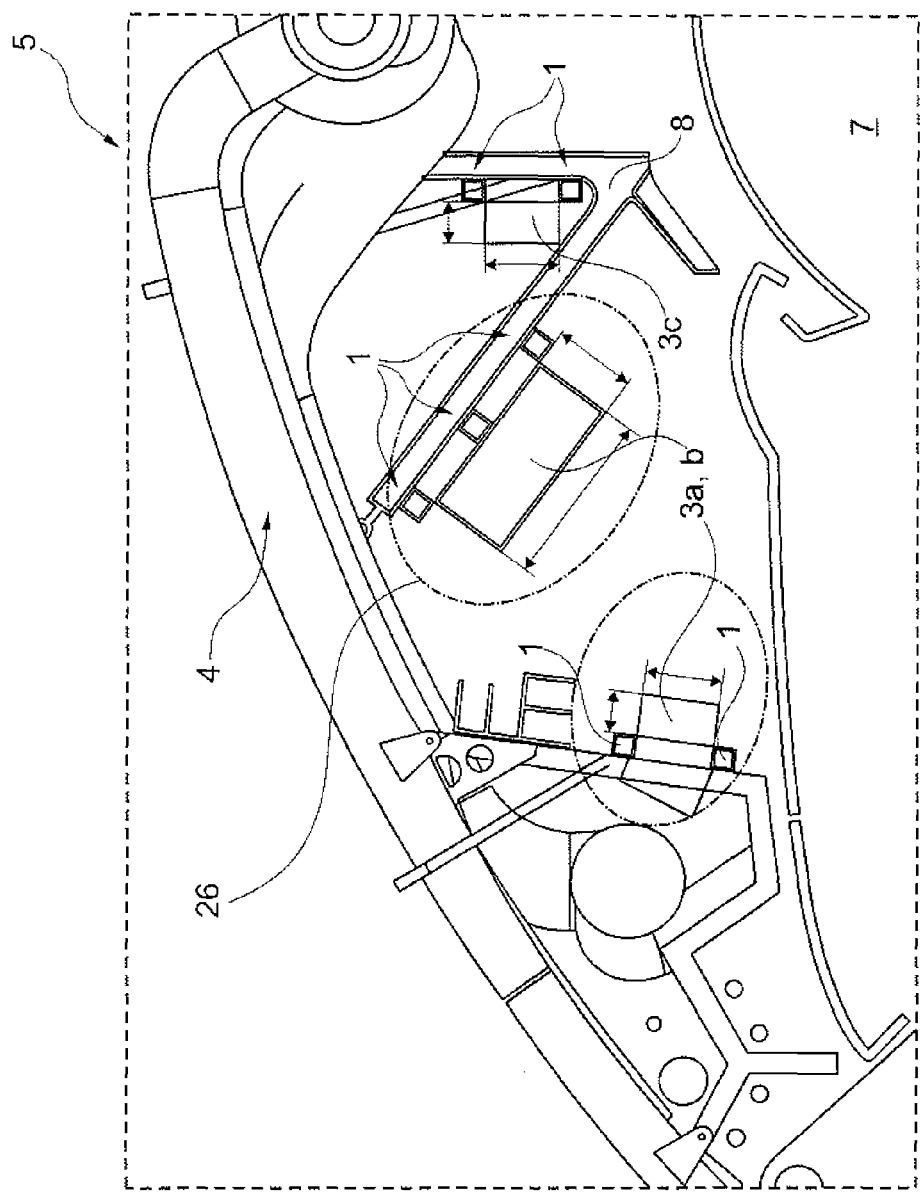
Figure 3:
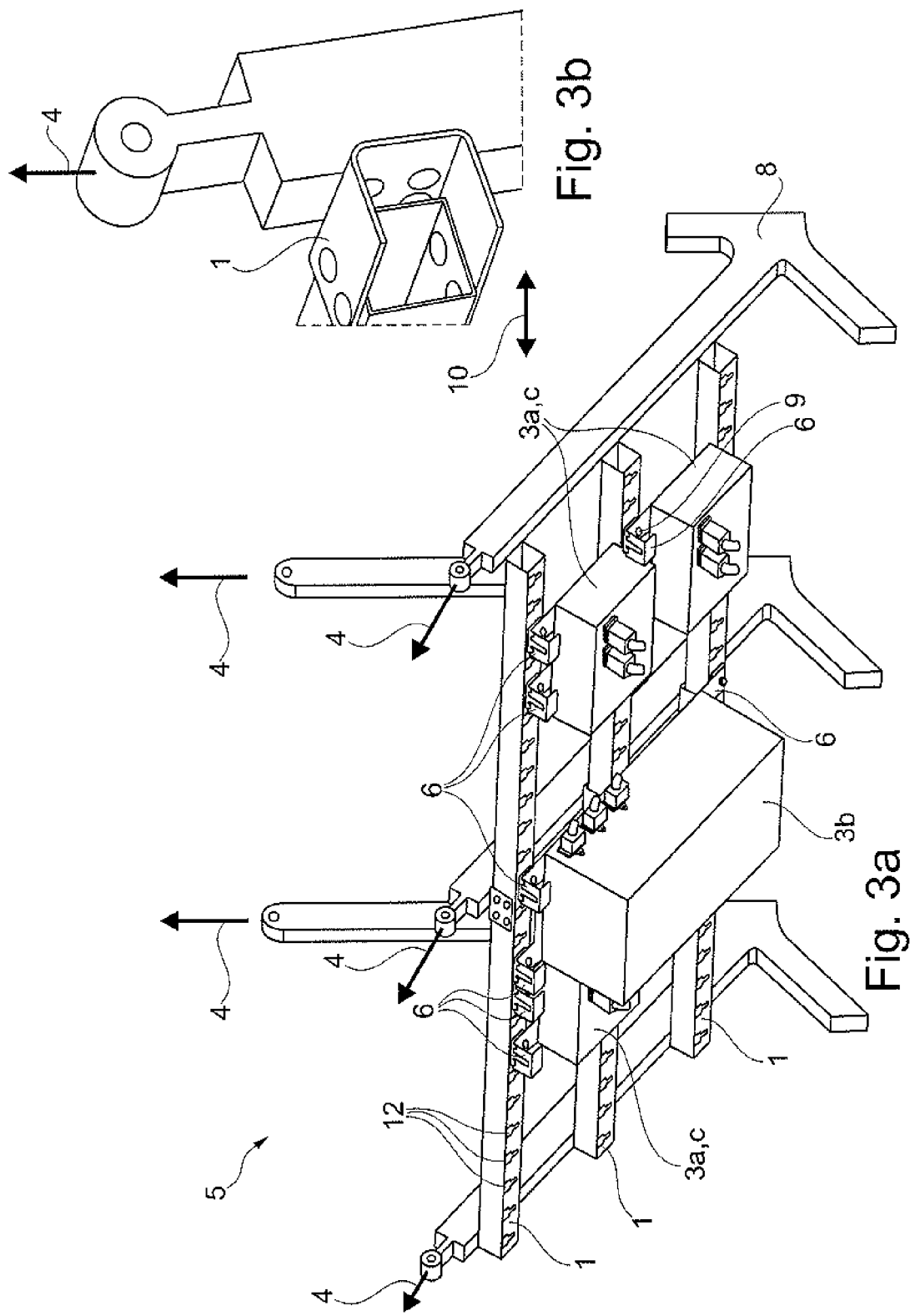
Figure 4:
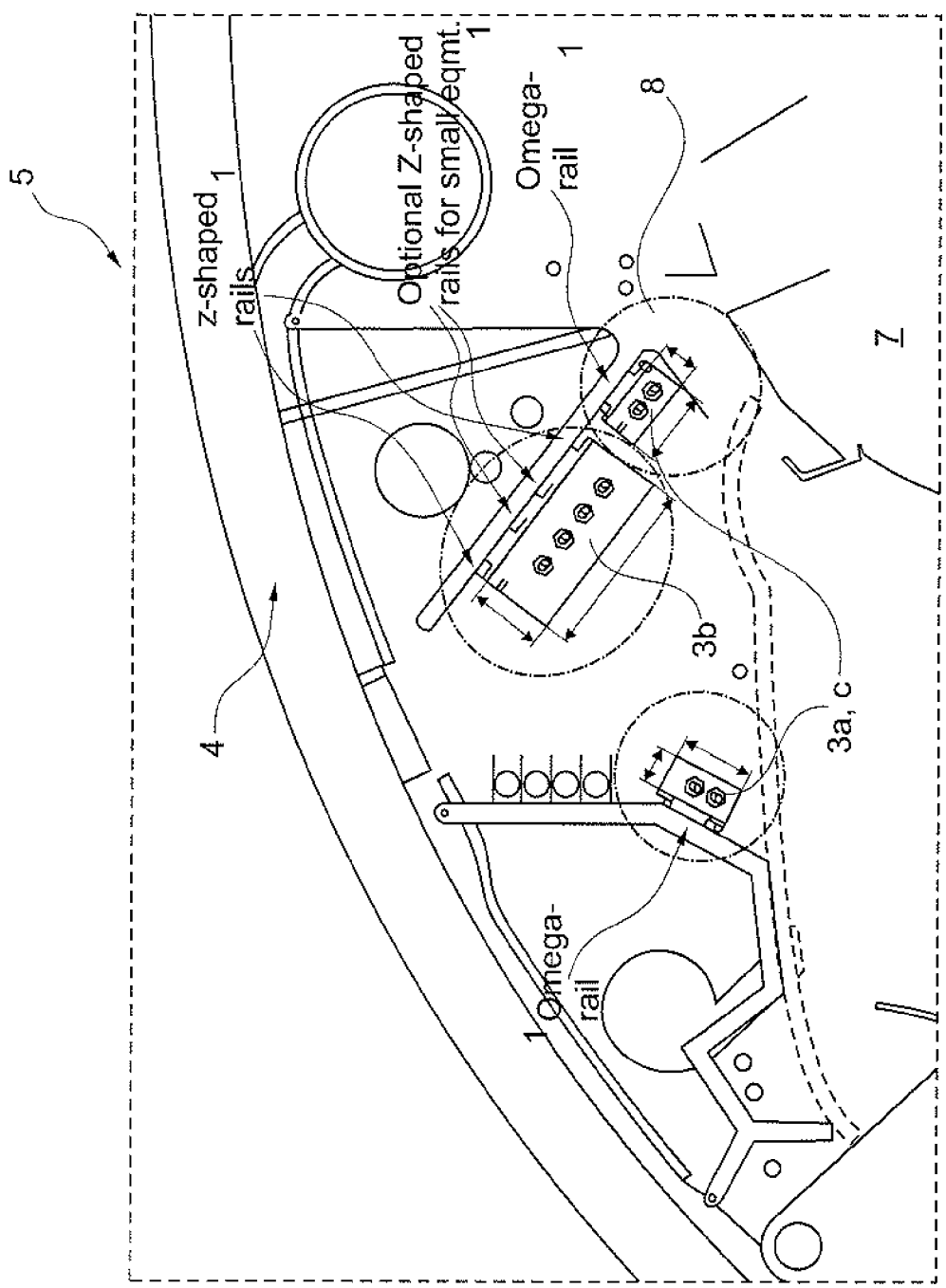
Figure 5:
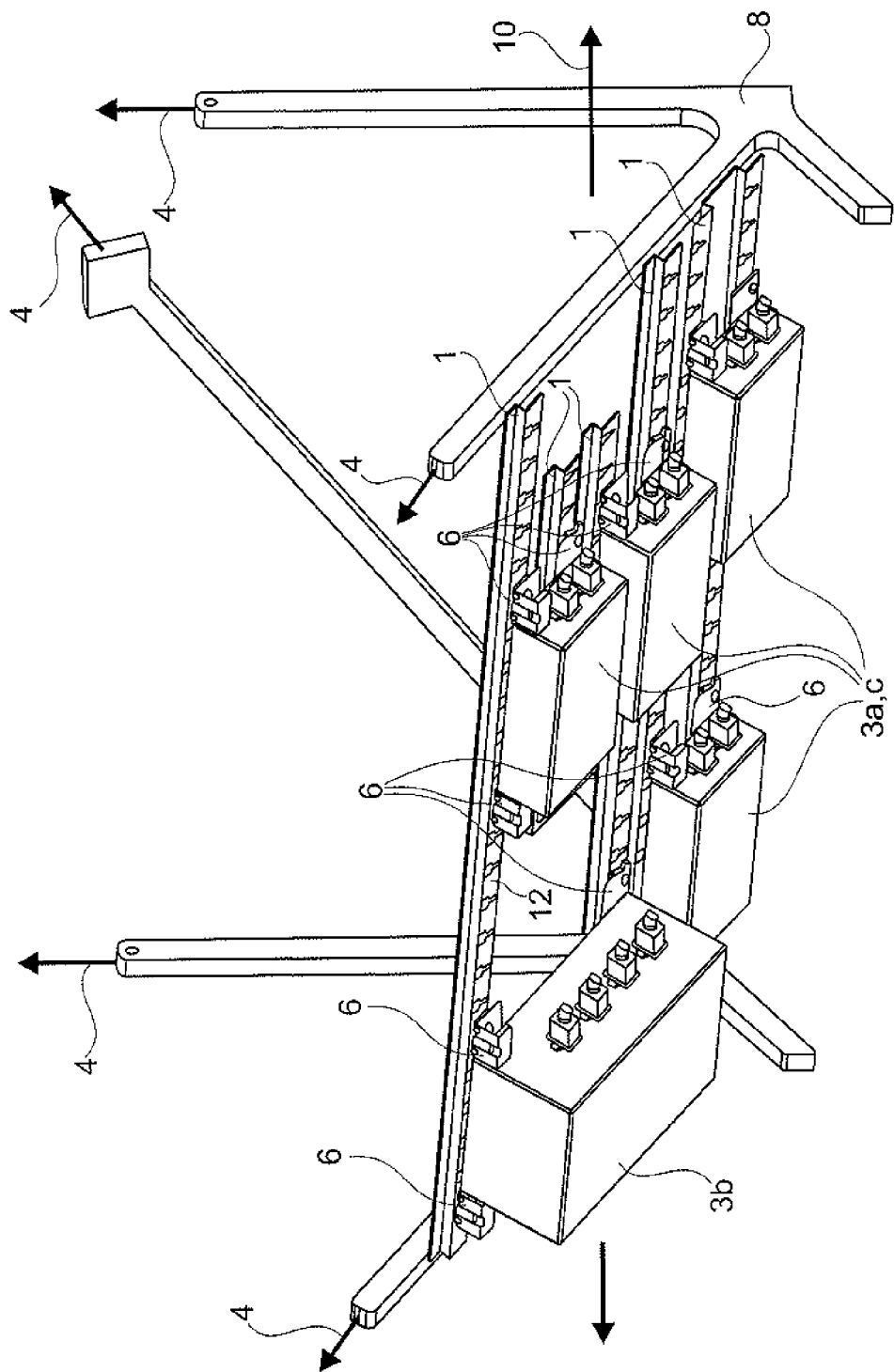
Figure 9:
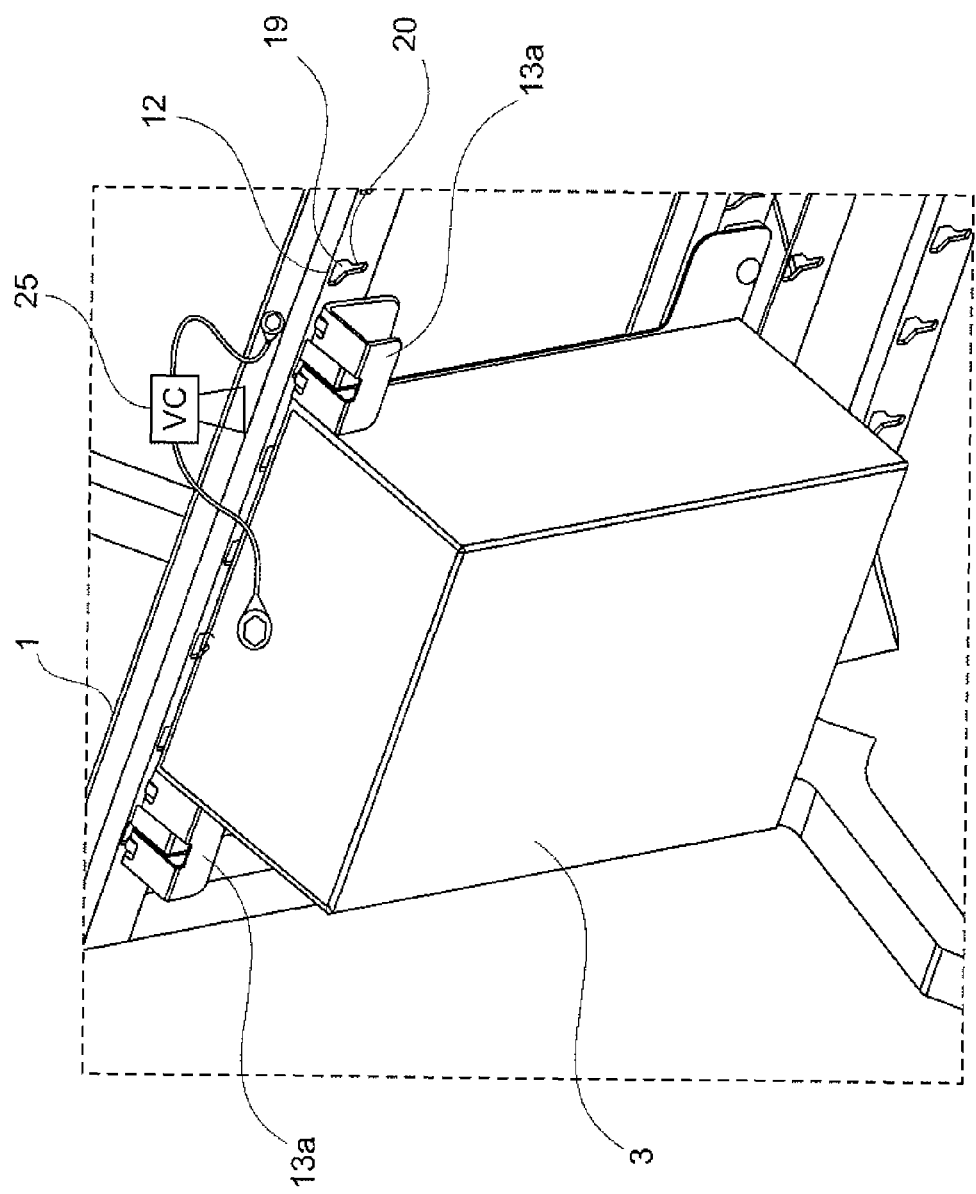
Figure 10:
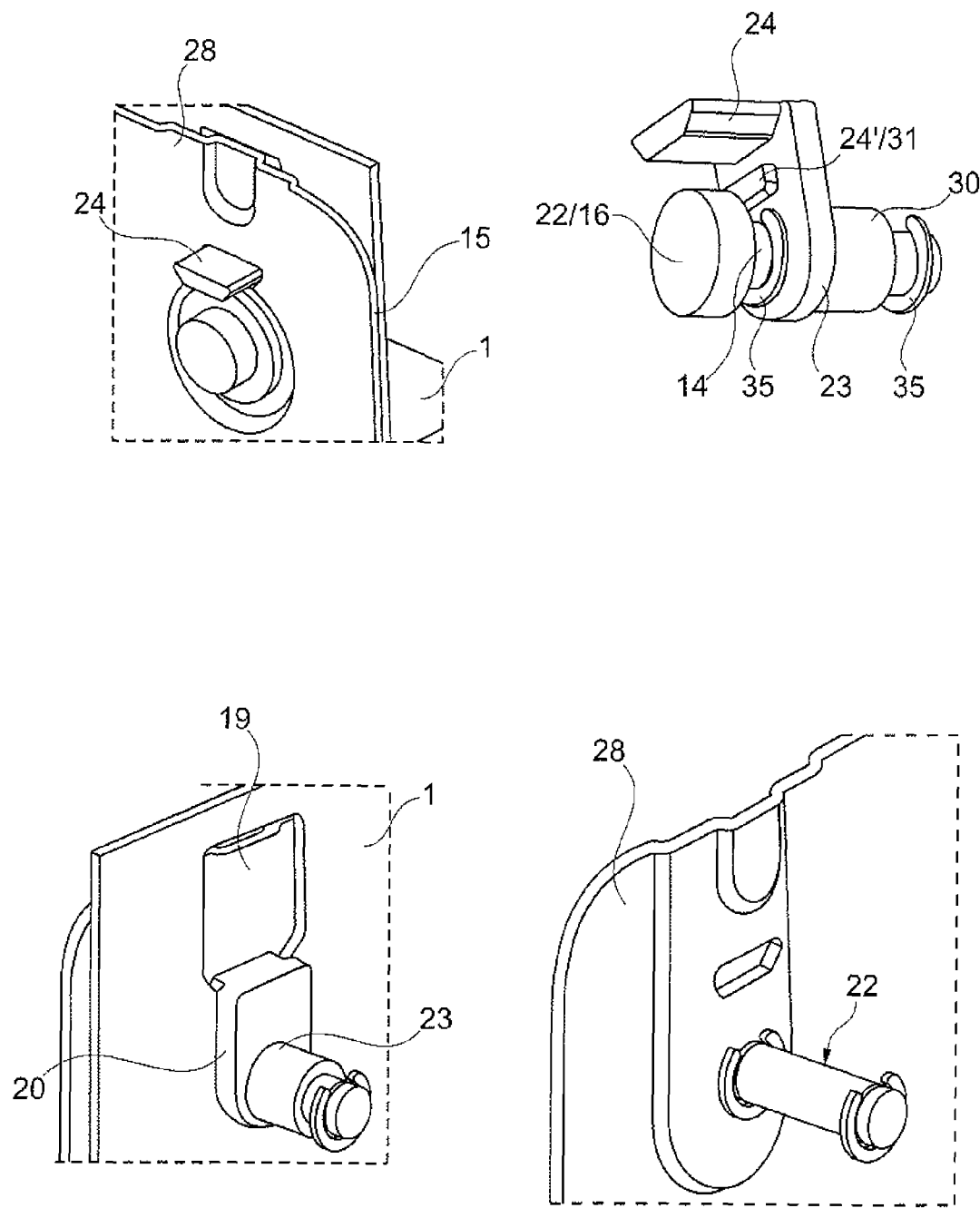
Figure 11:
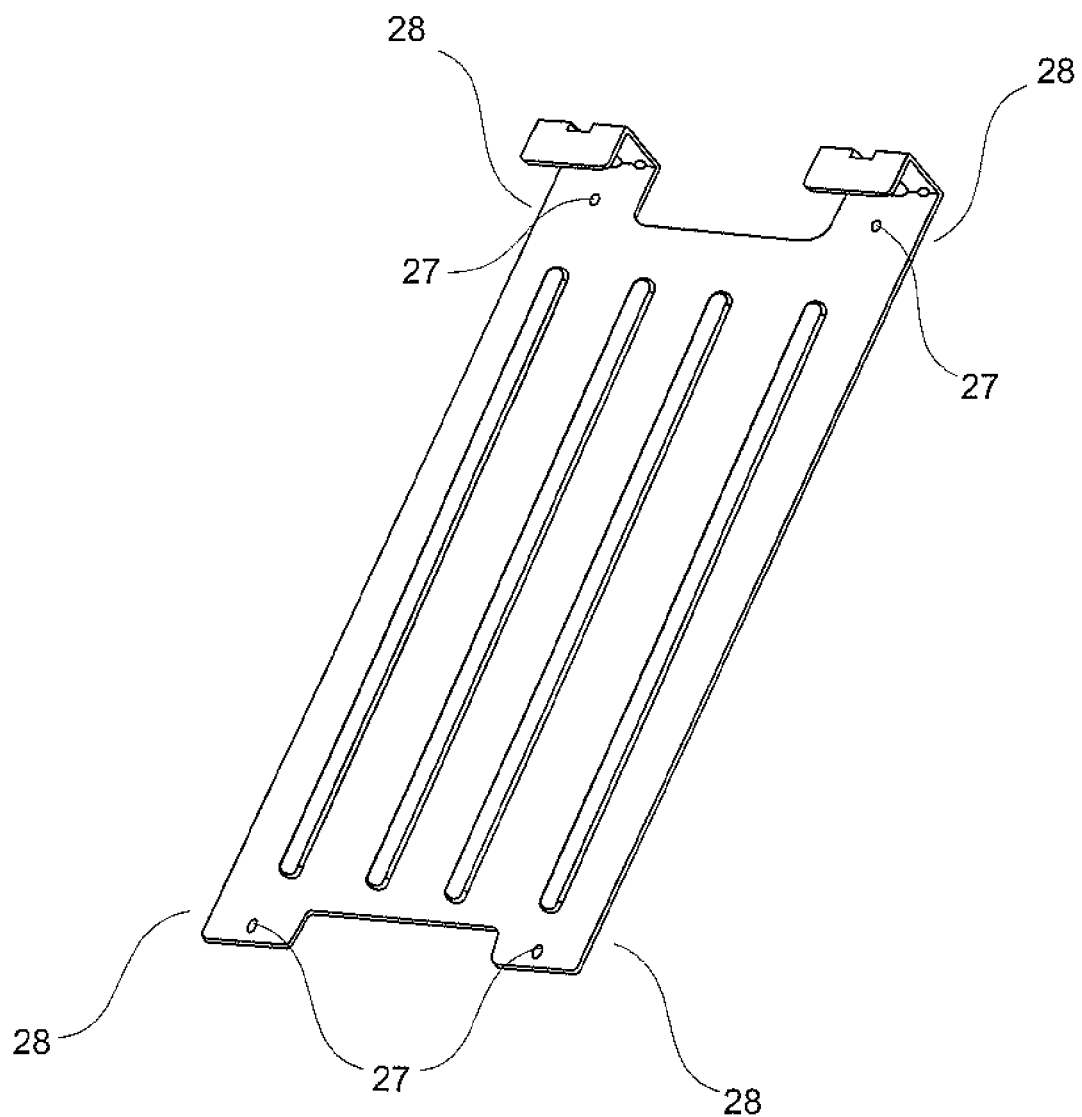
Figure 12:
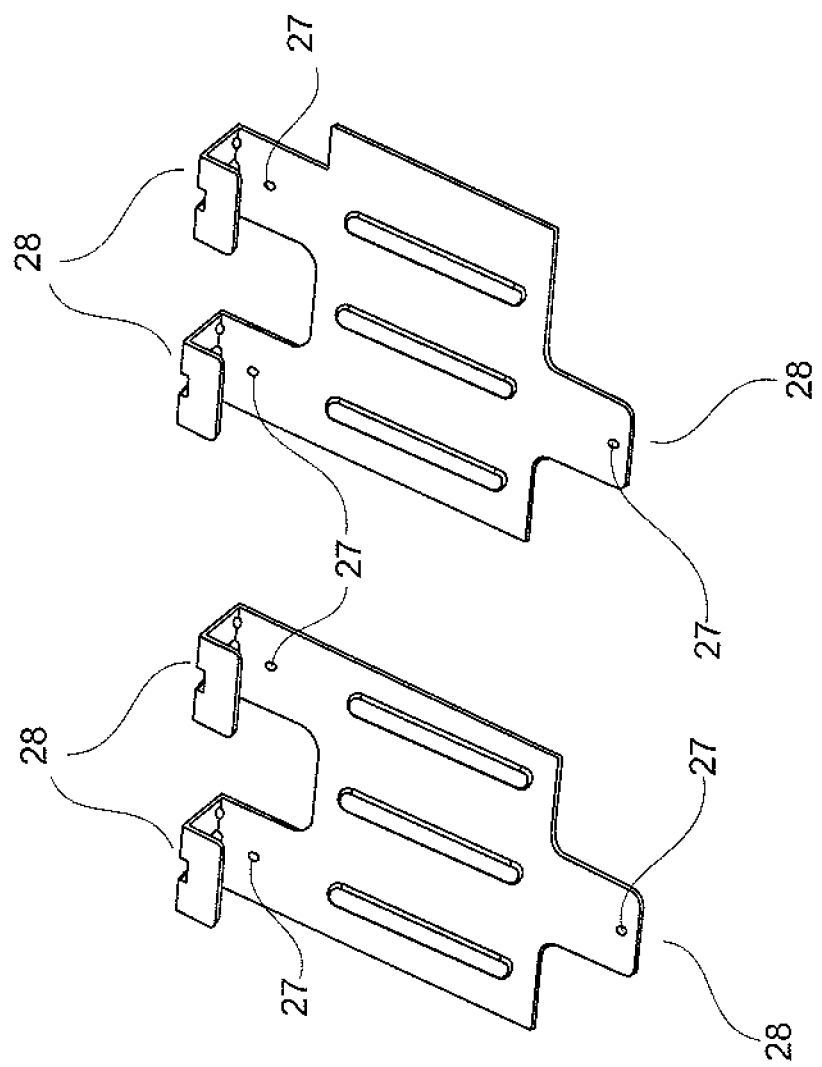

FIG. 1 an attachment system for attaching a component in an aircraft,

FIG. 2 a first arrangement of attachment structures according to an exemplary embodiment of the present invention in an aircraft, FIGS. 3a,b a first attachment structure according to an exemplary embodiment of the present invention, FIG. 4 a second arrangement of attachment structures according to an exemplary embodiment of the present invention in an aircraft, FIG. 5 a second attachment structure according to an exemplary embodiment of the present invention, FIGS. 6a-d a second attachment element as well as a plurality of embodiments of carrier elements according to an exemplary embodiment of the present invention, FIGS. 7a-e the mounting of a first and second attachment element according to an exemplary embodiment of the present invention, FIGS. 8a-d a blind screw connection according to an exemplary embodiment of the present invention, FIG. 9 a conductive connection of component and equipment structure by employing a conductive element according to an exemplary embodiment of the present invention, FIG. 10 a blind screw connection according to an exemplary embodiment of the present invention, FIGS. 11 and 12 different exemplary carrier elements according to an exemplary embodiment of the present invention.

Figure 13:
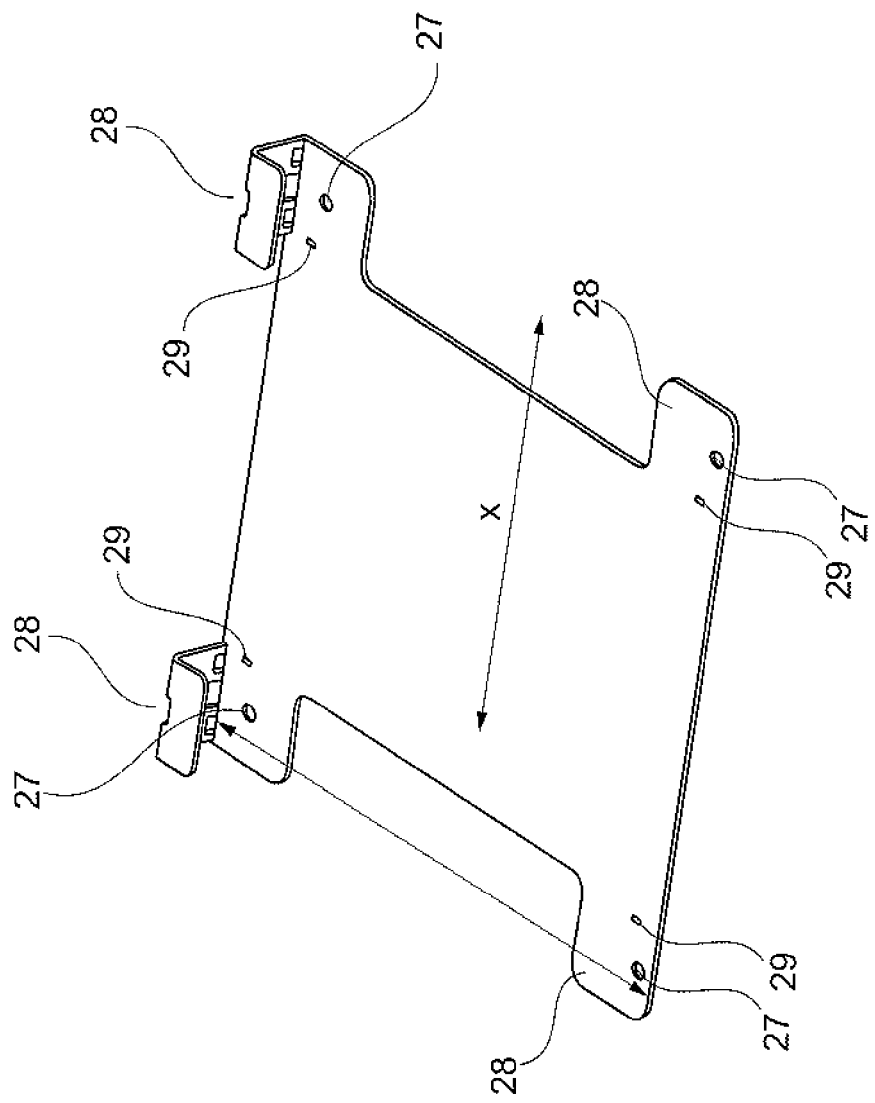
Figure 14:
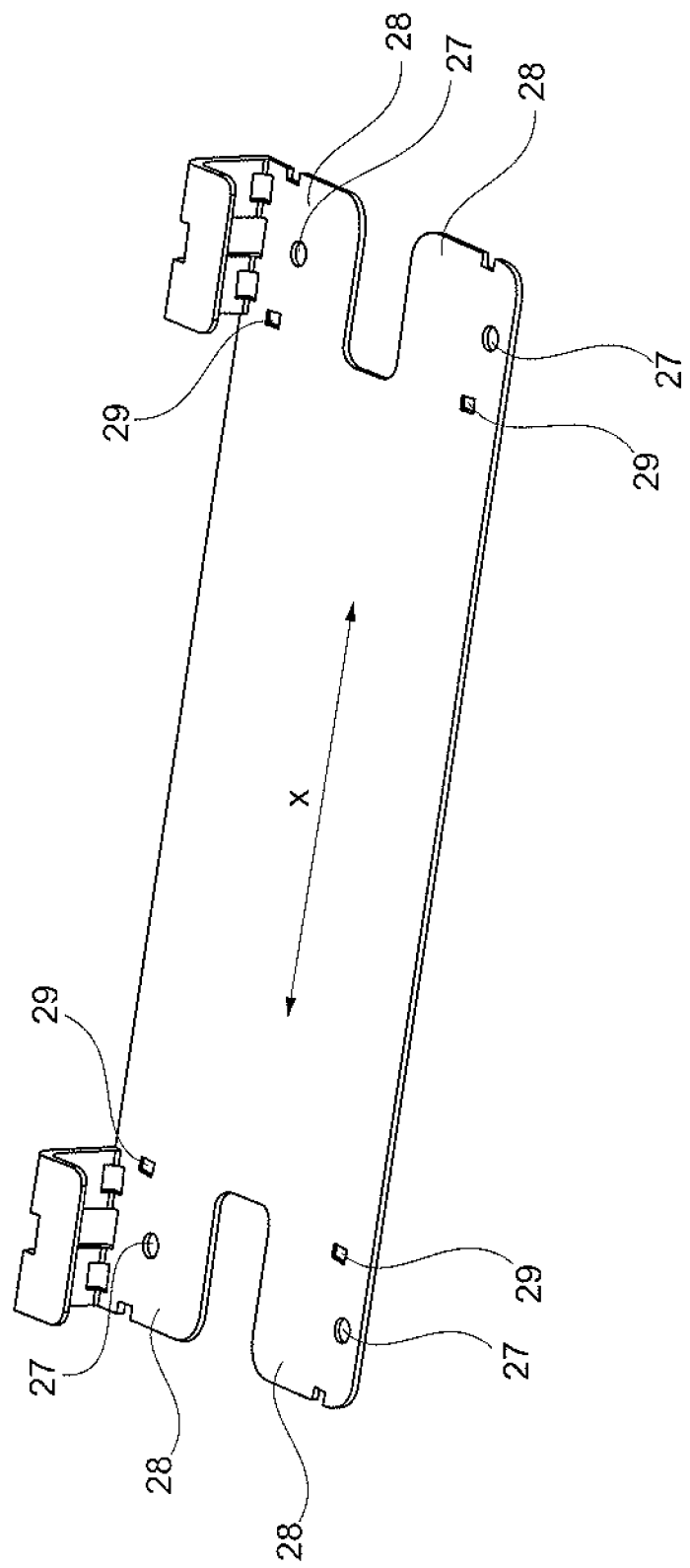
Figure 15:
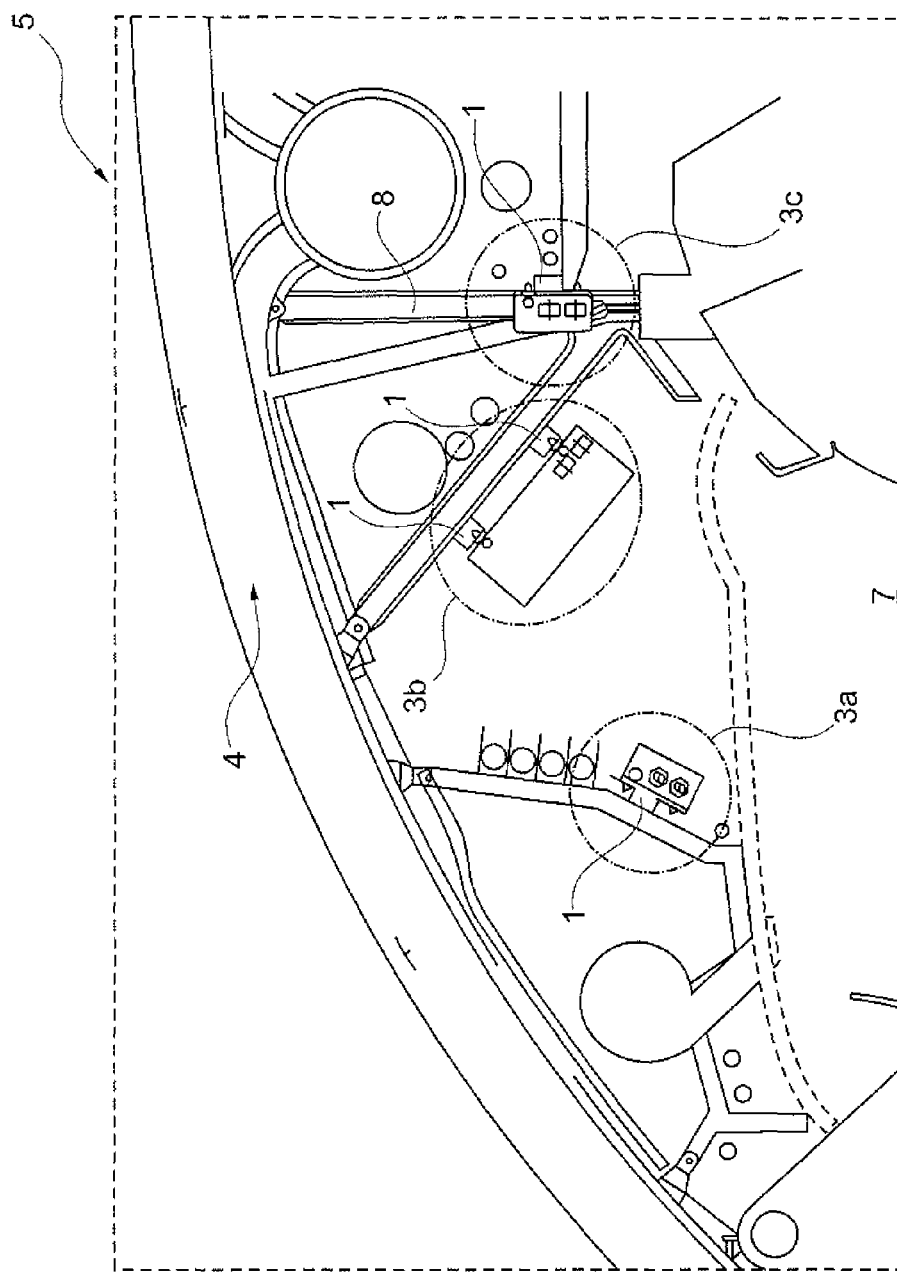
Figure 16:
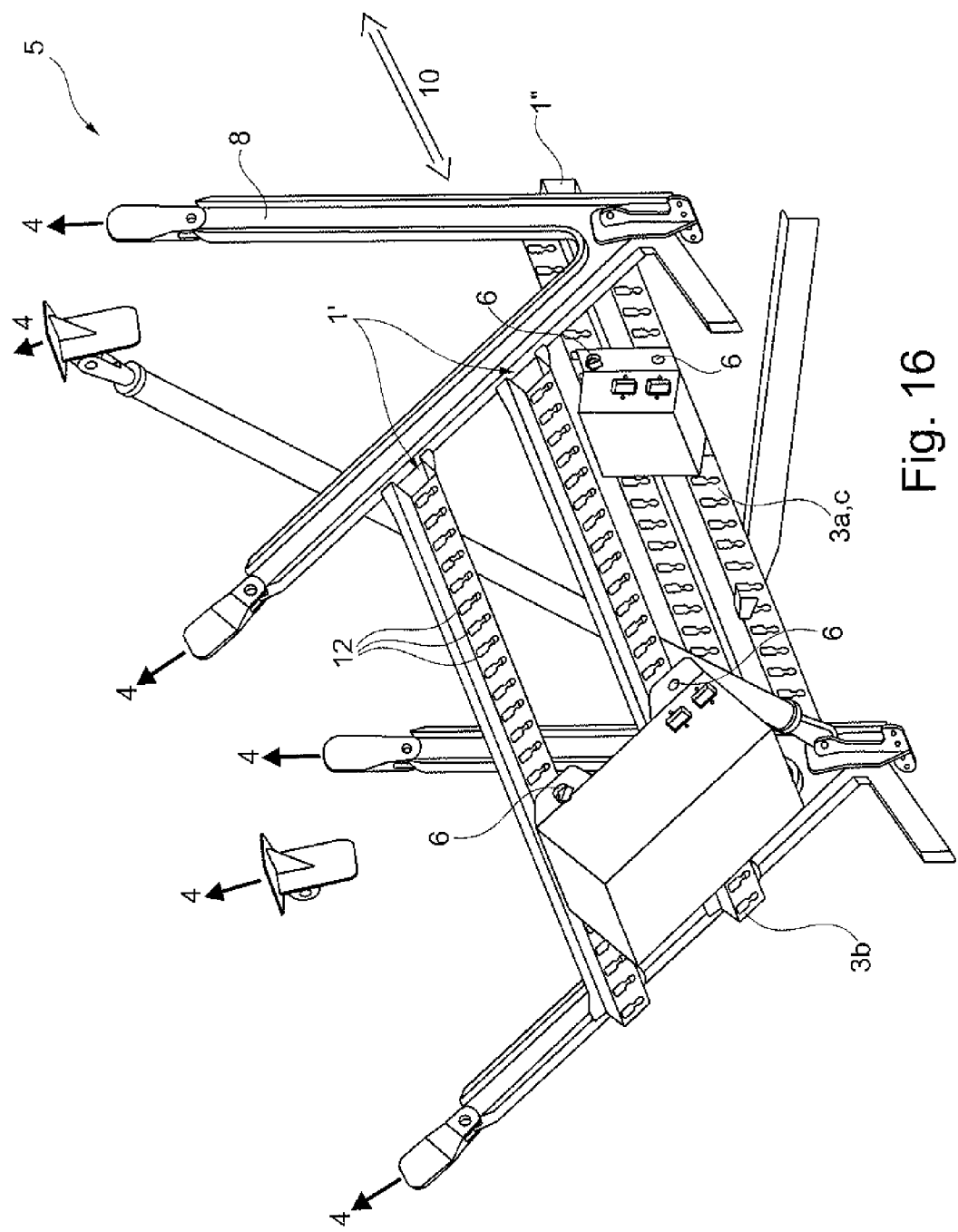

FIGS. 13 and 14 different exemplary adapter plates for mounting of non-standardized equipment components according to an exemplary embodiment of the present invention, FIG. 15 a third arrangement of attachment structures according to an exemplary embodiment of the present invention in an aircraft, FIG. 16 a third attachment structure according to an exemplary embodiment of the present invention, FIGS. 17a-c exemplary embodiments of the first as well as the second attachment element according to an exemplary embodiment of the present invention.

Figure 20B:
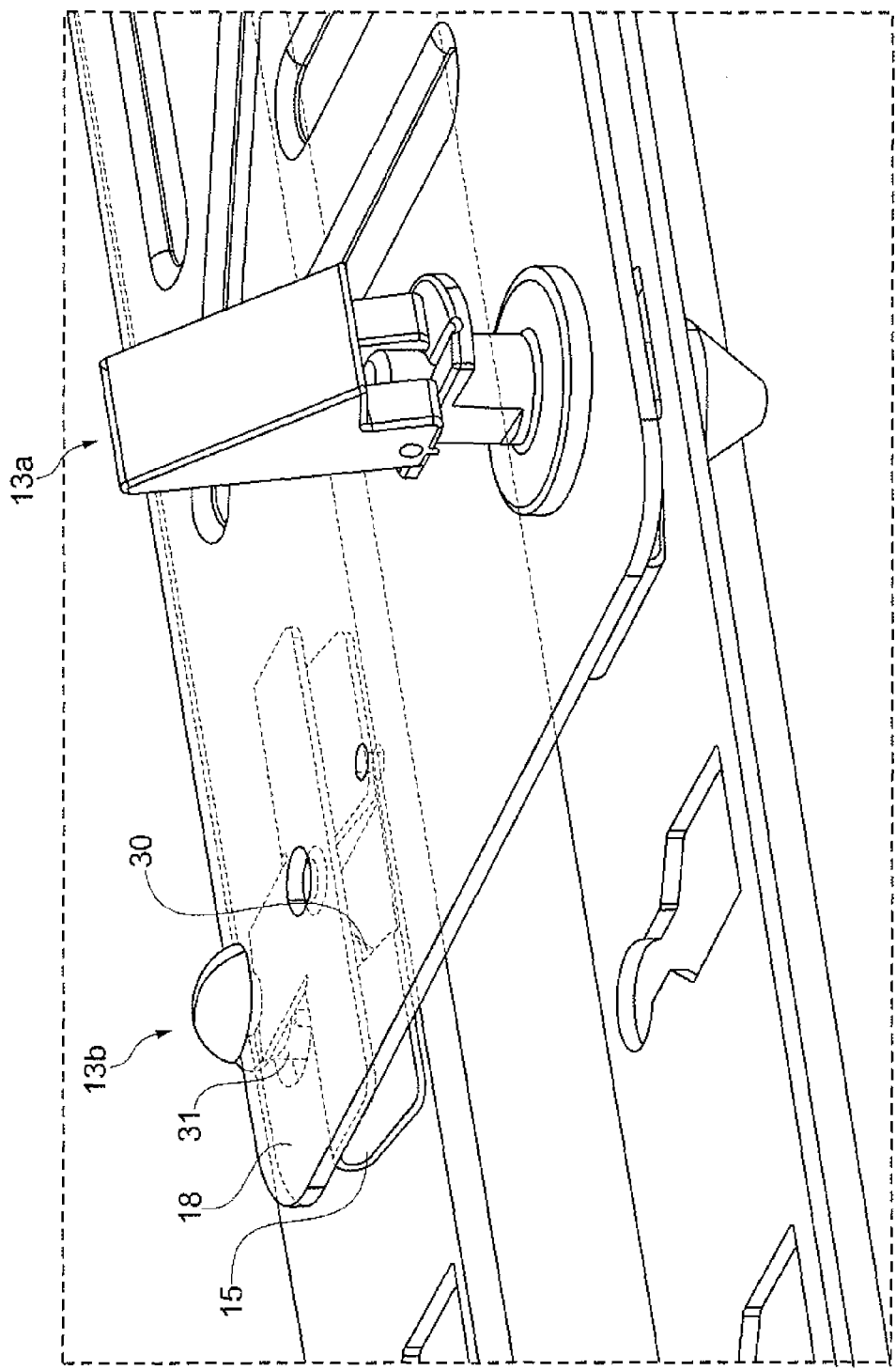
Figure 20E:
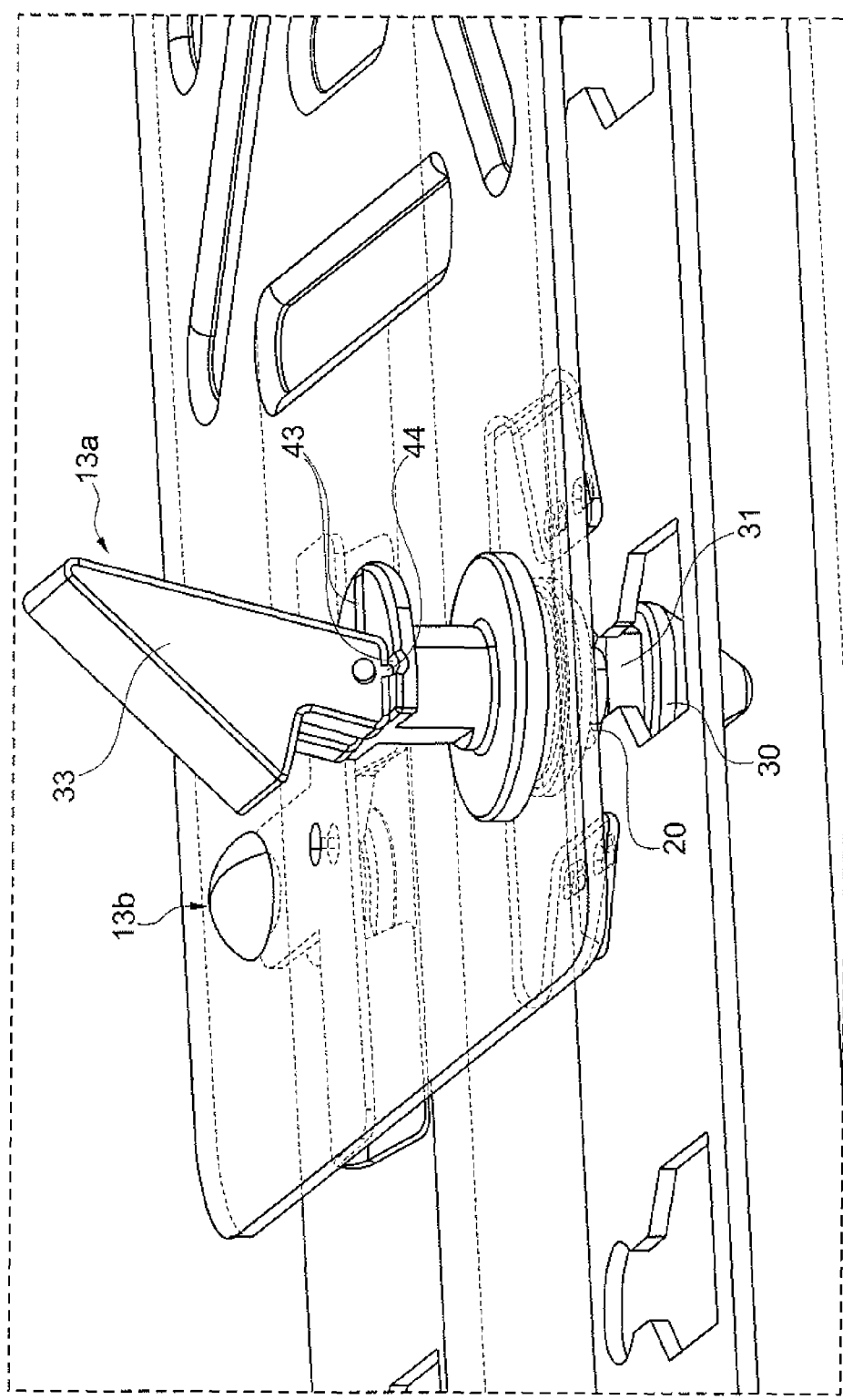
Figure 20H:
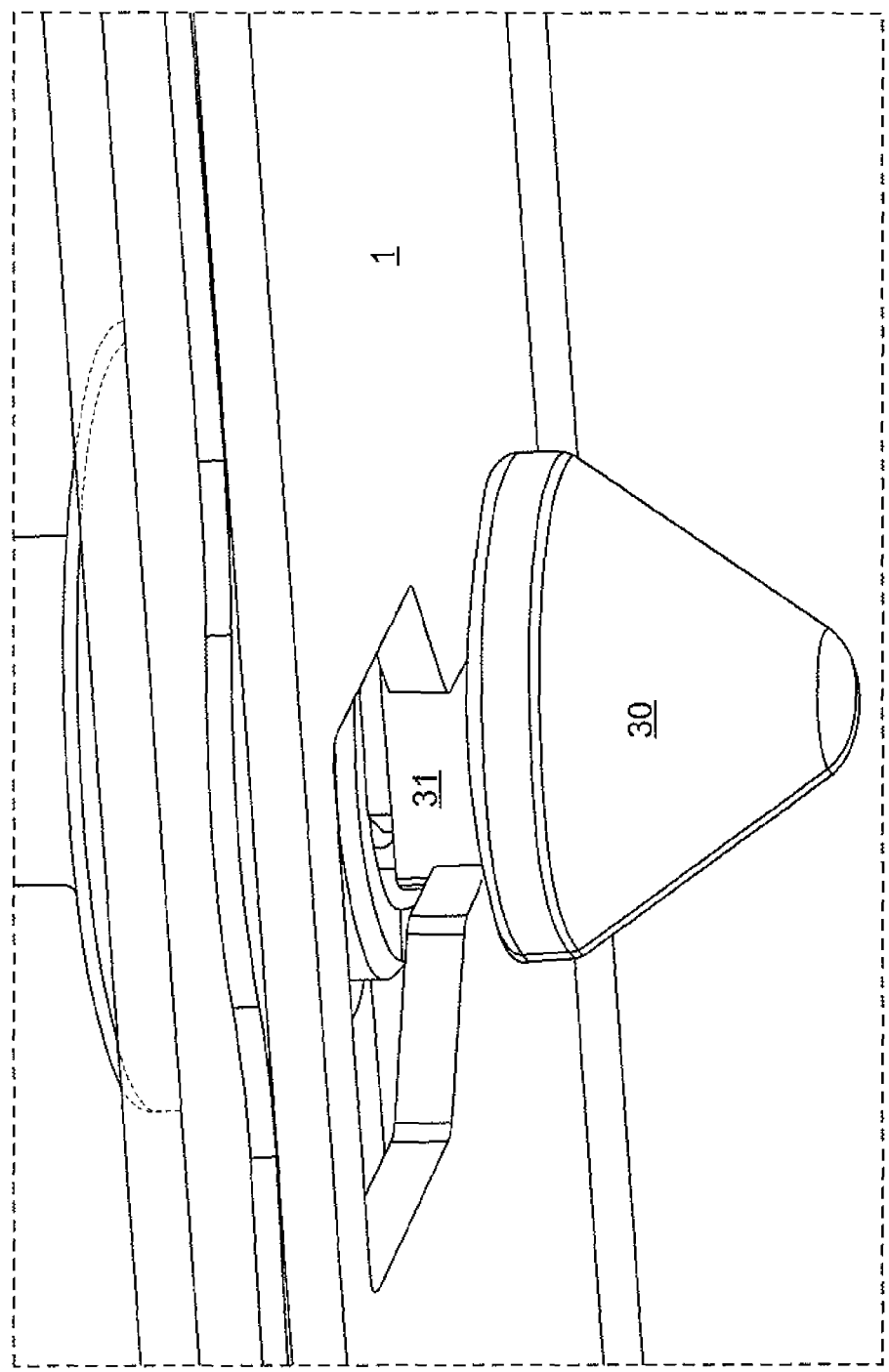
Figure 20I:
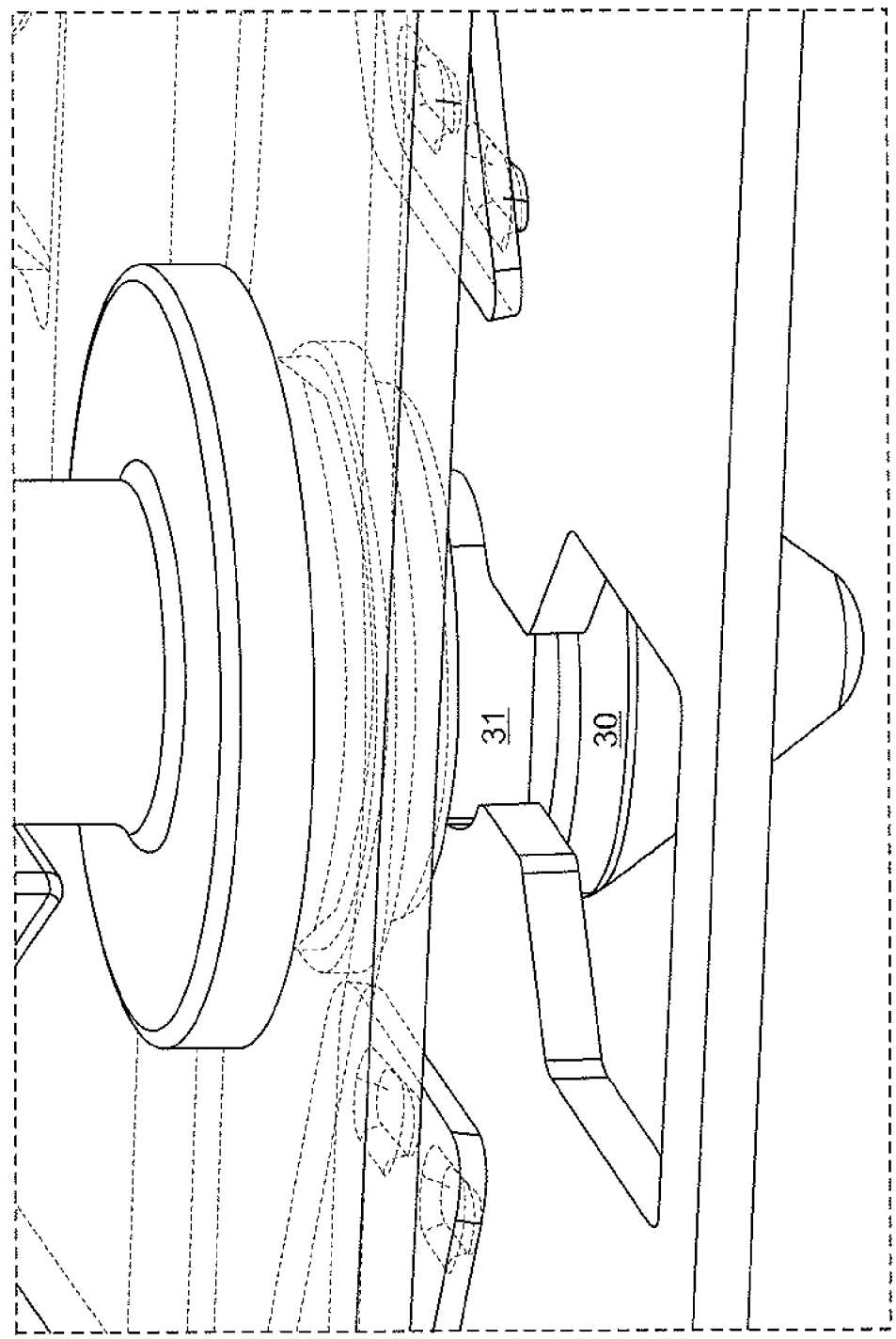
Figure 21A:
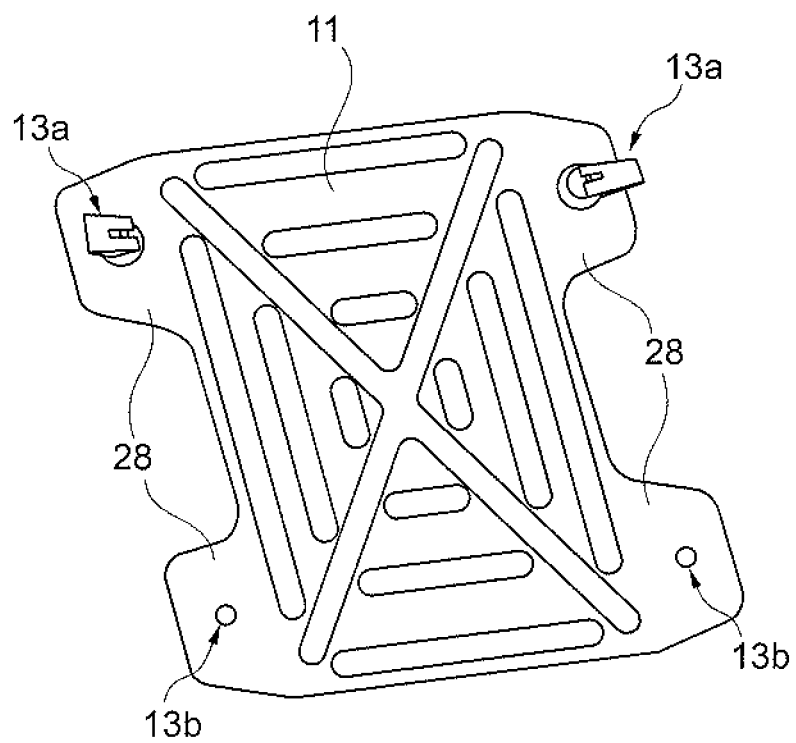
Figure 21B:
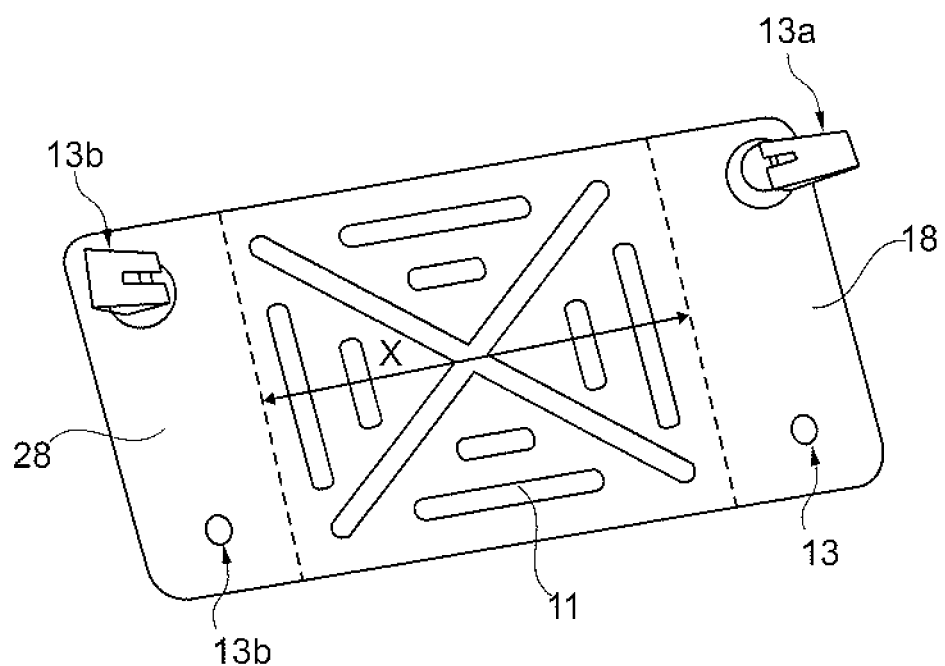
Figure 22:
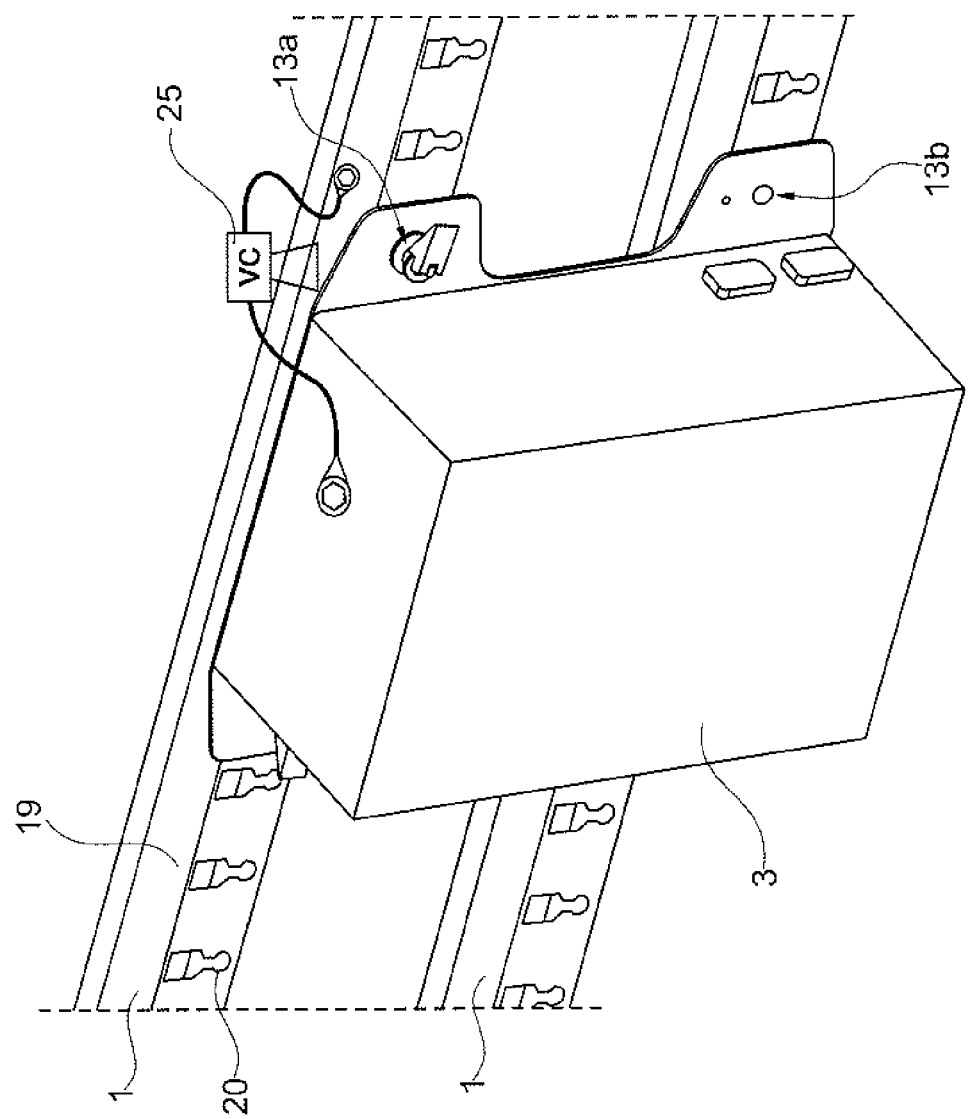

FIGS. 18a-d a mounting of a first and a second attachment element according to an exemplary embodiment of the present invention, FIGS. 19a-e a second attachment element as well as different embodiments of carrier elements according to an exemplary embodiment of the present invention, FIGS. 20a-i an insertion process of a component comprising a second attachment element 13a, FIGS. 21a and b different exemplary standard dimensions of equipment components according to an exemplary embodiment of the present invention, and FIG. 22 a conductive connection of component and attachment structure by employing a conductive element according to an exemplary embodiment of the present invention.

Taking reference to FIG. 1, an attachment system for attaching an equipment component in an aircraft is described.

The component 3 is attached to an attachment structure 1 by employing an adapter plate 2. The attachment structure in turn is attached to the aircraft structure 4.

The component 3 is attached to adapter plate 2 (not depicted in detail in FIG. 1), for example screwed to. The adapter plate 2 is connected to the attachment structure 1 by employing the attachment device 6 or the second attachment element 13.

Taking reference to FIG. 2, a first arrangement of attachment structures in an aircraft is described.

The attachment system 5 is exemplarily embodied to mount a first component 3b as well as two second components 3a,c to the aircraft structure 4.

Consequently the components 3b,c are coupled to the aircraft structure 4 by employing a V-bracket 8. The V-bracket 8 comprises two possibilities or positions to attach component 3.

FIG. 2 exemplarily depicts a cross-section through the aircraft, thus, the longitudinal extension 10 of the aircraft (x-axis) exemplarily runs perpendicular to the plane of drawing of FIG. 2.

Exemplarily seven attachment structures 1 are depicted in FIG. 2, which allow the mounting of components 3. The arrangement of attachment structures depicted in the center is able to attach one first component 3b as well as, in case of need, two second components 3a,c, next to each other.

The attachment structures 1 imaginary continue along the longitudinal axis 10 of the aircraft, thus perpendicular to the plane of drawing.

The arrangement of the attachment system 5 according to FIG. 2 exemplarily is arranged in the ceiling region of an aircraft cabin 7, the so-called "crown area".

Further arrangements of attachment structures 1, e.g. a fourth attachment structure 1 in the region of the three depicted attachment structures 1, is conceivable, e.g. for mounting of three small components 3a,c in the center area 26.

Further taking reference to FIGS. 3a,b, a first attachment structure is described.

In FIG. 3a, substantially a three-dimensional cut-out of the V-bracket 8 of FIG. 2 is depicted. Three second components 3a,c as well as a first component 3b are attached to attachment system 5. The three attachment structures 1 running in parallel allow the flexible mounting of components 3 by employing the attachment devices 6.

At the outer end of attachment system 5, in FIG. 3a depicted at the right side of FIG. 3a, two components 3a,c are arranged parallel next to/adjacent to each other or on top of/above each other. By employing the crown profile 9, both engage, with an attachment device 6, with the cental attachment structure 1.

The attachment structure 1 in FIG. 3b is exemplarily depicted as a rectangular rail, which is attached to a wing of the V-bracket 8, e.g. by riveting, by employing a U profile.

The mounting to the aircraft structure 4 is exemplarily indicated by mow direction 4 in FIGS. 3a,b.

Further taking reference to FIG. 4, a second arrangement of attachment structures in an aircraft is described.

Here, the attachment structures 1 are embodied as Z attachment structures 1 or Ω attachment structures 1, i.e. as attachment structures 1 in the shape of a Z or an Ω.

The attachment structures 1, shaped as Z or Ω, are adapted to allow a mounting of components 3 in a preset distance or position on the V-bracket 8.

In this regard, an Ω attachment structure 1 may substantially be understood as two Z attachment structures 1 arranged opposite to one another, being embodied integrally and/or attached to a common point of the aircraft structure, here again by the V-bracket 8.

In FIG. 4, the Ω attachment structures 1 are depicted exemplarily as being adapted to the components 3a,c regarding their size, so that the components 3a,c are mountable by employing a single Ω attachment structure 1.

An embodiment of an Ω attachment structure for mounting of a component 3b may also be conceivable.

In FIG. 4, the component 3b is mounted exemplarily by employing two Z attachment structures 1. Between said two outer Z attachment structures employed for mounting the component 3b, exemplarily two further Z attachment structures are depicted in FIG. 4.

Said allow the mounting of components 3a,c. Likewise, said two optional Z attachment structures 1 however may be replaced by an Ω attachment structure 1.

Further conceivable is an embodiment of distances of the individual attachment structures to the V-bracket, such that altogether up to five components 3a,c are mountable.

Further referring to FIG. 5, a second attachment system is described.

In FIG. 5, the V-bracket 8 of FIG. 4 is depicted again in a 3D illustration.

Again, the V-bracket 8 is arranged extending in the longitudinal direction of the aircraft/X axis 10. Thereby, the attachment structures 1, which are arranged on V-bracket 8, provide a flexible means for mounting of components 3.

Altogether four Z attachment structures 1 as well as one Ω attachment structure 1 are attached to V-bracket 8. The Ω attachment structure 1 in turn accommodates one component 3a,c, which is mounted to attachment structure 1 by employing the attachment device 6.

A component 3b is attached to the two outer Z attachment structures 1. Two further components 3a,c are attached to an outer Z attachment structure and in turn to one Z attachment structure being internally arranged.

As may be taken from FIG. 5, a flexible and individual mounting of individual components 3 may be realized by a suitable arrangement of the attachment structures 1.

Taking reference to FIGS. 6a-6d, an exemplary embodiment of the second attachment element 13 as well as different embodiments of carrier element 11 are described.

Depicted in FIG. 6a exemplarily are two different carrier elements 11a,b, which constitute the bottom side of components 3a,b,c. Carrier element 11a may exemplarily be associated to component 3b, carrier element 11b to components 3a,c.

Carrier element 11a comprises altogether four attachment devices 6 and thus altogether four second attachment elements 13. The distance between two second attachment elements 13 of carrier element 11a, which are mounted to the same attachment structure 1, exemplarily is $a_1$. The comparable distance of carrier element 11b is exemplarily referred to as $a_2$.

The minimal distance between two first attachment elements 12 may be distance d. Further, it is conceivable that the distance between two adjacent first attachment elements 12 is smaller than d, e.g. d/2.

In FIG. 6a, the small carrier element 11b exemplarily employs three second attachment elements 13. An arbitrary variation of at least three second attachment elements as well as a higher number of second attachment elements is conceivable, depending on the size or dimension and/or the weight of a component 3.

FIGS. 6b-6d show a magnification of the second attachment element 13. FIGS. 6b,c show a second attachment element 13, comprising a guiding element 14, in this regard embodied as a bolt 14 with a recess 18, a contact element 15 or spring element 15 as well as locking element 16 or locking spring 16.

In FIG. 6d depicted is a second attachment element 13b without locking element/locking spring 16. Thus, it may be preferable to provide only one side of component 3 with attachment elements 13a, comprising a locking element 16. Thereby, a simple and comfortable removal of component 3 from the attachment structure 1 may be realizable.

The contact elements/spring elements 15 are flexible and provide e.g. a pressure onto the attachment structure 1 so as to guarantee a mechanical and/or electrical contact. Also, a mere mechanical contact without electrical contact may be conceivable, e.g. for absorbing or equalizing of vibrations in the aircraft.

The guiding element 14 may be punctiformly screwed to the basis plate or the carrier element 11 of component 3 and may in particular comprise a preferred sphericity/roundness. Also, an integral embodiment with the carrier element 11 may be conceivable.

The contact elements 15 are embodied as spring elements, which are mounted to or are clamped to the ears 28 or the protrusions 28 of the carrier element 11 of component 3. Also, a screwing or welding of the contact elements 15 to the tongues 28 of the carrier element 11 is conceivable.

Between the split contact element 15 depicted in FIGS. 6b-6d, the locking element 16 is arranged centrally between the two parts of contact element 15, in the case of the second attachment element 13a. The locking element 16 comprises a substantially flat profile shape at that side pointing away of the guiding element 14, and a slightly slanted/inclined shape at the side pointing towards the guiding element 14.

Consequently, it may automatically engage or enter the first section 19 when moving the second attachment element 13 from the first section 19 to the second section 20 of the first attachment element 12, whereas, due to the flat side pointing away from guiding element 14, an automatic sliding out is effectively prohibited.

Thus, the second attachment element 13, due to the embodiment of the locking element 16, automatically provides a mechanical connection, which automatically locks or latches by the locking element 16.

The recess 18 of the guiding element 14 comprises all in all two flat sides, wherein one flat side is arranged towards carrier element 11 and one side is pointing away from carrier element 11.

Said recess 18 engages with the second section 20 of the opening of the first attachment element 12, when introducing the second attachment element 13 into the first attachment element 12.

Ultimately, the first attachment element 12 is clamped between the side of recess 18, which points away from the contact element 15 as well as contact elements 15. Depending on a certain embodiment, e.g. the materials, of first attachment element 12 or attachment structure 1, guiding element 14, contact element 15 and locking element 16, a conductive connection between first attachment element 12 and second attachment element 13 may be established.

Further referring to FIGS. 7a-7e, an operating sequence of the locking of a first attachment element 12 and a second attachment element 13 is described.

In FIG. 7a, the second attachment element 13 is introduced into the opening of the first attachment element 12. This is indicated by the arrow in FIG. 7a.

In this regard, the guiding element 14 is introduced into the first section 19 of the opening, which is wide enough to let pass the guiding element 14.

Depicted in FIG. 7b, the second attachment element 13 and thus also the component 3 connected therewith (not depicted in FIG. 7b) is moved according to FIG. 7b in the direction of the second section 20 of the opening, wherein now the recess of the guiding element 18 is moved from the first section 19 of the opening into the second section 20 of the opening. The dimensions of the second section 20 of the opening, the recess 18 of the guiding element as well as the guiding element 14 prevent a slipping out of the guiding element 14 by engaging from behind the attachment structure 18 by that part of the guiding element 14 that does not comprise the recess 18.

The recess 18 may be understood as a section, at which material was removed from the guiding element 14, and may be larger or wider than e.g. the material thickness of the attachment structure 1, so that the guiding element 14 may slide, with the recess 18, into the second section 20 of the opening to assure a secure mechanical and/or electrical contact. Contact elements 15 engage with or press against the attachment structure 1 from the side of the component 3 and so realize an elastic, mechanical and/or electrical contact between component 3 and attachment structure 1 via contact element 15.

Depicted in FIG. 7b, the guiding element 14 is in transition between the first section 19 of the opening and the second section 20 of the opening.

In FIG. 7c, the movement of FIG. 7b is continued, the guiding element 14 with its recess 18 is now in the second section 20 of the opening.

The contact elements 15 press against the attachment structure 1 and thus clamp the attachment structure 1 between itself and the guiding element 14. A mechanical and/or electrical contact may thus be established. Furthermore, the locking element 16 engages with the opening in the introduced end position according to FIG. 7c.

Thereby, a moving back, in FIG. 7c an upwards movement countering the depicted arrow is substantially blocked. Thus, the component 3 is effectively fixed to the attachment structure 1.

For a comfortable, easy and fast removal of the component 3 from the attachment structure 1, in turn the locking element 16 has to be removed from the opening of the first attachment element 12. Said is realized according to the exemplary embodiment of FIGS. 6 and 7 by a continuation 17 of the locking element 16, which is pulled (away) for detaching from the attachment structure 1. Thus, locking element 16 is removed from the opening and the inverse sequence of motion of FIGS. 7c-7a is allowed.

By the backwards movement or the moving away of the continuation 17 of the locking element 16 from the attachment structure 1, a release of the mechanically fixed connection of component 3 and attachment structure 1 may be realized, thus a removal of the component 3.

FIG. 7e shows a detailed illustration of the second attachment element 13 in introduced, locked state at the attachment structure 1. The curved or bent shape of the contact element 15 in the contact region of the attachment structure 1 may in particular be taken from FIG. 7e. Small semicircular contact points on the contact element 15 may preferably influence said effect.

The complete sequence of movement of introducing is shown by the three part arrow in FIG. 7d.

Number 1 of the arrow in FIG. 7d shows the lifting of the component 3 and thus the placing of the component 3 in front of the attachment structure 1 at the beginning of the mounting.

Number 2 of the arrow shows the insertion of the guiding element 14 into the first attachment element/opening.

Number 3 of the arrow shows the movement of the component 3 according to the FIGS. 7b and c up to the locking of the component 3 the opening of the attachment structure 1 by the locking element 16 in.

The length of the guiding elements 14 may be chosen so that during a sequence of installation, e.g. three guiding elements 14 are arranged within the opening of the first attachment element 12 and a further guiding element 14 of the same component is arranged outside the opening of a further first attachment element 12. Due to this and/or due to a rounded embodiment of the guiding element 14, a "blind" mounting of a component 3 on an attachment structure 1 may be realized.

Further taking reference to FIGS. 8a to 8d, a mounting of a carrier element to an attachment structure by employing a blind screw connection is depicted.

The blind screw connection 21 may provide all functions of the attachment element 13, those of guiding element 14, of contact elements 15 as well as of locking element 16.

The blind screw connection 21 is arranged at carrier element 11 and consists of a screw element 22 as well as a counter element/a nut 23. The counter element 23 comprises a protrusion or nose 24.

A component 3 with a blind screw connection 21 is inserted into the first attachment element/opening of the attachment structure similar to the movement of FIGS. 7a-7c.

The carrier element 11 with the component 3 is positioned such that the blind screw connection 21 is arranged in the second section 20 of the opening, as depicted in FIG. 8d. The screw element 22 may now be turned, which is not depicted in FIG. 8d, versus the counter element 23.

To prevent a simultaneous movement of the counter element 23 with the movement of the screw element 22, a protrusion 24 engages with a rim of the second section 20 of the opening and so prohibits the turning of counter element 23.

By e.g., a turning movement of the screw element 22, the blind screw connection 21 may be closed. Thus, the carrier element 11 is pulled towards the attachment structure 1 and is mechanically coupled with the same. Again, a mechanical and/or electrical contact between component 3, carrier element 11 and attachment structure 1 may be realized by an according blind screw connection 21.

The removal of component 3 or the carrier element 11 from the attachment structure 1 is realized by turning the screw element 22 of the blind screw connection in opposite direction as before, whereby the screw element 22 is moved relative to the counter element 23, which in turn opens or releases the mechanical pressing of screw element 22, carrier element 11, attachment structure 1 and counter element 23.

Further taking reference to FIG. 9, an alternative electrical coupling of component and attachment structure is depicted.

Depicted in FIG. 9, a component 3 is mounted to an attachment structure 1. In the case, that e.g. the second attachment elements 13 exclusively do realize a mechanical contact however no electrical or to assure an additional electrical contact, the conductive element/earth strap 25 is attached, as an additional connection, in between component 3 and attachment structure 1.

As depicted in FIG. 9, the conductive element 25 may be screwed to both the housing of component 3 as well as the attachment structure 1 and may constitute a conductive element itself, e.g. a cable or an earth strap (e.g. a braided metal band).

For a fast coupling/removal, e.g. for a fast demounting of the component 3, the conductive element 25 may comprise a mechanically releasable intermediate part, e.g. a quick disconnect element, VC. Both ends of the conductive element 25 may e.g. be attached to, e.g. screwed to, the attachment structure 1 and/or the component 3 employing a cable lug.

Further taking reference to FIG. 10, a blind screw connection according to an exemplary embodiment of the present invention is depicted.

The blind screw connection is attached to an ear 28 of a component 3a,b,c with a screw element 22 as well as a counter element 23. Screw element 22 and counter element 23 are connected by a thread such that the screw element 22 may be screwed into and out of counter element 23.

A turning of counter element 23 is prevented by a protrusion 24, which rises over an opening in the ear 28. The opening in this regard also provides a linear guiding of the counter element 23.

The side of the counter element 23 facing towards the screw element 22 thus constitutes the connecting element 30. The thread of that part of the screw element 22, which is accommodated in the counter element may be considered as the guiding element 14.

The contact element 15 is realized by a direct screwing of ear 28 onto the attachment structure 1. The head of the screw element 22, possibly having a washer underneath, acts as locking element 16. A small second protrusion 24' at counter element 23 provides the positive locking functionality of the positive locking element 31 or the connecting element 30.

A component 3a,b,c comprising a mounted blind screw connection is introduced with opened counter element (a state in which the counter element is (maximally) spaced apart from the ear 28 of the component 3a,b,c) into the first section 19 of the first attachment element 12 and is subsequently moved in the direction of the second section 20.

The slanted, tapered underside (the side directed towards screw element 22) of protrusion 24 rests against the also suitably slanted transition region of the opening between the first section 19 and the second section 20. By screwing of the screw element 22 from the side of the component 3a,b,c, i.e. the front side, the connecting element 30 is moved in the direction of the ear 28, the component is thus fixed.

In the mounted and tightened state, an indentation of the ear 28 engages with the first section 19 and inhibits a movement, thus a removal of the first and the second 13a,b attachment element against the force-fit connection of the screw connection. The indentation rests against the upper edge of the first section at the inside and thus constitutes a positive locking together with the screw connection.

Further taking reference to FIGS. 11 and 12, different exemplary carrier elements according to an exemplary embodiment of the present invention are described.

Accordingly, the carrier element 11 of FIG. 11 comprises all in all four connection points for four second attachment elements 13. Contrary hereto, the carrier elements of FIG. 12 comprise exemplarily only three connecting points for second attachment elements.

The second attachment elements are mounted to the illustrated ears 28 of the carrier elements 11 of FIGS. 11 and 12, in particular in the mounting holes 27. The further details of the second attachment elements correspond to those of FIGS. 6b-d. In this regard, the carrier elements 11 of FIG. 11 or 12 preferably depict the integral embodiment as part of the housing of equipment component 3.

Further taking reference to FIGS. 13 and 14, different exemplary adapter plates for mounting of non-standardized equipment components are described.

In this regard, the exemplary adapter plate 2 of FIGS. 13 and 14 substantially differs from the carrier elements 11 of FIGS. 11b and 12 by the additional integration of mounting holes 29 for attaching non-standardized equipment components, e.g. by screwing.

While the carrier elements 11 or the adapter plate 2 of FIGS. 11 to 13 may substantially engage with two different attachment structures 1, the adapter plate 2 according to FIG. 14 may preferably be substantially attached to one $\Omega$-rail. Also, the single mounting to exclusively one attachment structure may be feasible with the embodiment of the adapter plate according to FIG. 14.

Further taking reference to FIG. 15, a third arrangement of attachment structures according to an exemplary embodiment of the present invention in an aircraft is described.

The attachment system 5 again is arranged at an aircraft structure 4 on top of an aircraft cabin 7. Two small components 3a,c, each attached to an attachment structure 1, exemplary depicted as $\Omega$ structure (omega-structure), as well one large component 3b, attached to two attachment structures 1, exemplary embodied in this regard as inverse $\Omega$ structures are exemplary depicted in FIG. 15.

An $\Omega$ structure as well as an inverse $\Omega$ structure substantially differ by interchanging the connecting points at the aircraft structure as well as the component. While at an structure the attachment means pointing outward are attached to the component and the centrally arranged attachment means are attached to the aircraft structure, with the inverse $\Omega$ structure, the component may be mounted in the central area, while the structure itself, via its ends pointing outwards to the sides, are attached to the aircraft structure or the V-bracket 8.

Further taking reference to FIG. 16, a third attachment structure according to an exemplary embodiment of the present invention is described.

In FIG. 16 again depicted is an attachment system 5, here exemplary depicted as V-bracket 8. The V-bracket 8 comprises all in all three attachment structures 1, wherein the two attachment structures 1' are embodied as inverse $\Omega$ structures, while the structure 1" is embodied as $\Omega$ structure. A large component 3b is exemplarily mounted to both attachment structures 1', while the attachment structure 1" exemplarily comprises one small component 3a,c.

The components 3a,b,c are attached to the attachment structures 1 each time employing a plurality of attachment devices 6. The individual attachment structures 1 comprise a plurality of first attachment elements (openings) 12. Indicated in the direction of the aircraft structure 4, the V-bracket 8 is attached to this aircraft structure and runs in the longitudinal extension 10 of the aircraft.

Further taking reference to FIGS. 17a-c, exemplary embodiments of the first as well as second attachment elements according to an exemplary embodiment of the present invention are described.

In FIG. 17a, an exemplary embodiment of a second attachment element 13a is depicted in exploded view.

The second attachment element 13a comprises a guiding element 14, which, at its end, comprises a connecting element 30, which connecting element 30 again comprises a positive locking element 31. A three part embodiment or also an integral embodiment of guiding element 14, connecting element 30 and positive locking element 31 may equally be feasible.

The guiding element 14 may be considered a cylindrical element, wherein the cylinder surface may be employed for guiding in the opening of an attachment element.

The connecting element 30 engages the first attachment element 12 in the second section from behind and thus provides a positive locking by accommodating or pressing the attachment structure 1 between connecting element 30 and contact element 15.

The guiding element 14 comprises a receptacle 39, e.g. a continuous opening for a bolt 34. Further, the second attachment element 13 comprises a spring element 32, a contact element 15, a retaining element 35, a spacing element 38 as well as a lever element 33, which is attached to the guiding element 14 in receptacle 39 by bolt 34.

The guiding element 14 is moved through the spring element 32, through the retaining element 35 and through a central opening of the contact element 15 for mounting. Furthermore, the guiding element 14 is moved through an opening 40 of the spacing element 38.

The end of guiding element 14 comprising the notches or flat portions 41 as well as the receptacle 39 or bolt 34 thus projects out of the opening 40 of the spacing element 38. The notches may e.g. be embodied on one side or on both sides opposite each other. By using the bolt 34, the lever element 33 is attached to the guiding element 14. For this, the jaws 45 of the lever element 33 surround the end of the guiding element 14 with the notches 41.

The bolt 34 connects the guiding element 14 and the lever element 33. The jaws 45 of the lever element 33 here rest against the flattened sides of the notch 41 and surround or encompass them substantially free of play, so that a tilting motion of the lever element 33 about the axis of bolt 34 is possible.

The spring element 32 is attached to the guiding element 14 and is arranged substantially directly adjacent to the positive locking element 31, in the mounted state.

The spacing element 38 is connected to the contact element 15 by employing the retaining element 35. The spacing element is attached to the contact element in a well-defined manner, by being aligned by groove 36 as well as peg 37 and projects in the mounted state through the central opening of contact element 15. At the side of the spacing element 38 pointing away from the lever element 33, a retaining element 35, e.g. a spring lock washer, is attached, so that contact element 15 is arranged between retaining element 35 and spacing element 38.

Thus, spacing element 38, contact element 15 as well as retaining element 35 are attached to one another and mounted substantially free of play. A possible component 3a,b,c in an aircraft to be mounted may further be arranged between spacing element 38 and contact element 15 and may thus at the same time be secured or supported by retaining element 35. In other words, the second attachment element 13a may be attachable to a component 3a,b,c.

In the mounted state, the guiding element 14 with attached spring 32 projects through a unit consisting of retaining element 35, contact element 15 and spacing element 38 and is connected by bolt 34 with the lever element 33 at the side of the notches 41.

The lever element 33 is substantially tillable by the angle α, e.g. 180°, 95°, 90°, 85° or 80° and may thus acquire one of e.g. three end positions 46a,b,c.

The outer surface of spacing element 38 pointing away from contact element 15 comprise groovings 43, which here are exemplarily embodied perpendicular to one another, forming a cross. As counterpart, the lever element 33 comprises a lug 44, which may engage with the groovings. By a pretension of spring element 32 in the assembled state, a force is required to move the lever element to one of the three end positions 46a,b,c or to move in between them.

In the mounted state, the spring 32 rests, on the one hand, against positive locking element 31 and against spacing element 38, at that side of spacing element 38 (in the region of the retaining element 35) pointing towards contact element 15. The opening in the lever element 33 for accommodating the bolt 34 comprises different distances c,c',c'' to the side of the respective end positions 46a,b,c.

Accordingly, depicted in FIG. 17a, the center of the opening for accommodating the bolt 34 of the lever element 33 has the distance c from the side of the end position 46b, c' from the side of the end position 46a as well as distance c'' from the side of the end position 46c. An end position 46a,b,c is acquired by lever element 33 in such a way, that the respective side of the lever element 33 of the end position 46a,b,c is substantially resting against the flat surface of the spacing element 38, in which surface also the groovings 43 are accommodated.

In each of the three end positions or position states 46a,b,c, spring 32 is in a (pre)-tightened, compressed state. Exemplarily depicted in FIG. 17a, the spring comprises the least pretension in position 46b and in end position 46a the largest pretension of the three end positions. The pretension of end position 46c is between the pretensions of both end positions 46a and 46b, since also c<c''<c' applies. In FIG. 17a, the lever element 32 is exemplarily depicted in end position 46a, even though in the context of the exploded view.

In end position 46b as well as 46c, the guiding element may be turnable about its longitudinal extension (direction from connecting element 30 to receptacle 39). In particular, in end position 46c, no preferred position of the guiding element is provided. Since the guiding element, in its explained construction and in its parts essential to its functionality, is embodied unsymmetrically substantially only with regard to the positive locking element 31 (and contact element 15), a rotation of the guiding element 14 by the lever element 33 may be substantially understood as a rotation of the positive locking element 31.

In end position 46b, the lug engages with the groovings 43 in two preferred orientations. Depicted in FIG. 17a, both positions are arranged at an angle of 90° relative to one another, defined by the angle occurring between the two groovings 43. In each grooving 43, the positive locking element 31 is substantially arrangeable in two positions, which are arranged parallel to one another.

In end position 46a, as depicted in FIG. 17a, a part of the lever element 33 protruding sideways engages along the flat portion 42 of lever element 33 or rests against said flat portion 42. Thereby, it is realized substantially free of play, that the positive locking element 31, together with the lever element 33, may not be turned any more in end position 46a.

The contact element 15 is embodied as spring element 15 and comprises at its side pointing towards connecting element 30 contact springs 47, which contact the attachment structure 1 when mounting a component 3a,b,c and thus provide a force-fit, substantially vibration-free or vibration dampening mechanical connection and/or an electrical contact.

Further taking reference to FIG. 17b, an enlarged top view from the direction of the guiding element with its side comprising the receptacle 39 is depicted.

The connecting element 30 is exemplarily depicted as being circular. Mounted to the connecting element 30 is positive locking element 31, which comprises a first extension b' as well as a second extension b, wherein the extension b' is smaller than the extension b. The outer sides of the positive locking element 31 of length b are embodied circular with diameter b.

In other words, the positive locking element 31 is embodied substantially rectangular and in each case comprises two substantially parallel sides with length b as well as b'. The sides with length b are thereby arranged in the shape of a circle, also having the diameter b. The positive locking element 31 is concentrically aligned with regard to the guiding element 14, so that the circular shaped sides b of the positive locking element 31 feature a circular path when rotating the positive locking element 31 about the axis of the longitudinal extension of the guiding element 14.

The connecting element 30 comprises a diameter b". The shape of the connecting element 30 itself is depicted as a conically tapered cone to allow a preferred insertion into the first section 19 of opening 12. An arbitrary different embodiment is conceivable, e.g. cylindrical, spherical, rectangular etc., as long as the dimensions of the connecting element 30 allow the insertion of the same into opening 12.

By a turning of the lever element 33 in end position 46b or 46c, in the illustration of FIG. 17b, the positive locking element 31 is rotated or turned about the circular shaped axis of the guiding element 14, wherein the circular shaped surface sides b of the positive locking element 31 substantially realize a circular path.

Guiding element 14 is exemplary depicted in FIG. 17b having a diameter smaller than b'. Further diameters of guiding element 14 may be conceivable, e.g. substantially identical to b' or possibly even larger than b', as long as the spring element 32 may still rest against the positive locking element 31.

Further taking reference to FIG. 17c, an exemplary embodiment of an attachment structure, adapted to the second attachment element 13a of FIG. 17a, is depicted.

The attachment structure 1 comprises a first attachment element 12 with a first section 19, which is exemplarily embodied in this regard as a rectangular with the dimensions of the lateral edge a". In this regard, a" is preferably larger than b", so allowing an insertion of the second attachment element 13a,b, in particular of the connecting element 30, through the first section 19 of the opening 12.

Adjacent to the first section 19, a tapering is arranged at a distance a', which distance a' preferably is larger than b', so to allow a passing through of the positive locking element 31 from the first section 19 to the second section 20 (in a position as depicted in FIG. 17b).

The attachment structure 1 may comprise such a material thickness or the second attachment element 13a may comprise such a distance between the lower side of the contact springs 47 and the inner surface of the connecting element 30, so that during a corresponding guided movement, the connecting element 30 must be moved, with positive locking element 31, through the tapering between first section 19 and second section 20 of the opening, without being allowed to pass under the same.

The second section of the opening 12 is hereby also exemplarily depicted as a circle with diameter a. Diameter a and diameter b of the positive locking element 31 are adapted to one another such that a positive locking, substantially free of play, may be realized.

After the second attachment element 13b has been moved substantially completely from the first section 19 to the second section 20 of the opening, a subsequent rotation of the positive locking element 31 in the second section 20 of the opening 12 may be provided by employing the lever element 33.

E.g., by a rotation about 90°, which is provided by the perpendicular alignment of the groovings 43 to one another, the positive locking element 31 may be arranged turned about 90° versus the illustration of FIG. 17h, thereby exemplarily being arranged crosswise in accordance with FIG. 17c (parallel to extension a' of the tapering) in the second section 20 of the opening 12. By the tapering having a distance a' between first section 19 and second section 20 of the opening 12 and the dimensions a and b, adapted to one another free of play, a further moving shifting or slipping of second attachment element 13a in the second section 20 or out of the same is prevented.

By an according turning of the positive locking element 31, the first attachment element 12 and the second attachment element 13a are engaged relative to one another in a positive locking manner. A component so attached to the attachment structure 1 by employing the second attachment element 13a and thus attached to the aircraft structure 4 is substantially equally attached free of play or in a positive locking manner.

Further taking reference to FIGS. 18a-d, a mounting of a first and a second attachment element according to an exemplary embodiment of the present invention is depicted.

In FIG. 18a, the second attachment element 13a is introduced into an opening 12 of an attachment structure 1. Here, the exemplarily conically tapering shape of the connecting element 30 allows an easy inserting and positioning of the second attachment element in the first section 19 of the opening before the attachment structure comes in contact with the contact element 15.

In FIG. 18b, the second attachment element 13a is inserted substantially until contact element 15 is resting against attachment structure 1.

In FIG. 18c, the second attachment element 13a is moved from the first section 19 into the second section 20 of opening 12, thus is arrived at its end position.

Depicted in FIG. 18d, a component 3a,b,c is mounted to an attachment structure 1 with two rails. The component 3a,b,c comprises exemplarily two second attachment elements 13a according to FIG. 17a as well as two second attachment elements 13b, which may be embodied substantially as depicted in FIG. 17a, however without the possibility to vary, by using a lever element 33, a variable length or the distance between a lower side of contact springs 47 and the inner upper side of connecting element 30.

In the case of the second attachment element 13b, the positive locking element may also substantially be omitted, so that an attachment structure is arranged between contact springs 47 and inner surface of connecting 30 and being supported by contact springs 47 in a force-fit manner, which contact springs 47 at the same time possibly providing an electrical contact.

Further taking reference to FIGS. 19a-e, a second attachment element as well as different embodiments of carrier elements according to an exemplary embodiment of the present invention are depicted.

In FIG. 19a exemplarily a large component 3b is depicted, while in FIG. 19b exemplarily a small component 3a,c is depicted. The two second attachment elements 13a, in each case arranged at the upper side of the component 3a,b,c, are depicted magnified in FIGS. 19d and e, the second attachment elements 13b are exemplarily depicted in FIG. 19c at the lower side of the component 3a,b,c.

FIG. 19c comprises a second attachment element 13b, which substantially only consists of contact element 15, guiding element 14, depicted as connecting element 30, as well as (in FIG. 19c depicted, provided) positive locking element 31, in the form of a non-rotatable positive locking element 31. The components are attached to the component 3a,b,c via ear 28. An omission of positive locking element 31 may be conceivable. FIG. 19d shows a second attachment element 13a, attached to an ear 28 of a component 3a,b,c. A rotation capability about the longitudinal axis of the guiding element 14 is exemplarily depicted in FIG. 19d by the circular arrow with rotation axis. Further, a tilting motion from end position 46b (dashed) to end position 46a (solid) of lever element 33 is depicted.

Further taking reference to FIGS. 20a-i, an insertion sequence of a component comprising a second attachment element 13a is depicted.

FIG. 20a shows an attachment structure 1 with a plurality of first attachment elements 12. A second attachment element 13a, attached to an ear 28 of a component 3a,b,c is subsequently to be fixed in the opening 12. The second attachment element 13a comprises an embodiment according to FIG. 17a and comprises in particular the guiding element 14 with connecting element 30 as well as positive locking element 31, contact element 15, retaining element 35, spacing element 38 as well as lever element 33. Lever element 33 is arranged in end position 46b, with peg 44 engaging with a grooving 43. The side of the second attachment element 13a comprising the connecting element 30 as well as the positive locking element 31, is arranged in the first section 19 of the opening 12. The contact elements 15 rest against the surface of the attachment structure 1, so that the positive locking element is substantially arranged at least in part in the opening 12 of the first attachment element and thus does not tower below the same.

Small dents or shapes are arranged at the contact element 15, for obtaining a defined contact or defined contact points. Said points may increase the ampacity and may avoid sharp contact points. Thereby, a damaging of the contact surface may be avoided.

In FIG. 20b, the illustration according to FIG. 20a is depicted from a different point of view, wherein also the second attachment element 13b is recognizable. The element 13b also comprises a contact element 15, which however is slightly differently embodied than the contact element 15 of the second attachment element 13a.

The contact springs 47 of the contact element 15 at the second attachment element 13b point away from the same in the direction of the second attachment element 13a. The second attachment element 13b is attached to an ear 28 with a positive locking element 31 and a connecting element 30. The attachment structure 1 comprises a first attachment element 12 in the area of the second attachment element 13b, which is substantially comparable with the first attachment element 12 in the area of the second attachment element 13a.

In FIG. 20c, the second attachment element 13a,b is moved from the first section 19 of the opening 12 into the second section 20 of the opening 12. The positive locking element 31 is arranged with its small sides parallel to the sides of the tapering with dimension a', so allowing a sliding through of the positive locking element 31.

FIG. 20d shows in detail an intermittent state between the first section 19 and the second section 20 and in particular the alignment of the positive locking element 31.

Small dents or pins are arranged at the contact element 15 to allow a preferred, possibly corrosion-free contact.

In FIG. 20e, the second attachment elements 13a,b are arranged substantially completely in the second section 20 of openings 12. Further depicted is an management of the positive locking element 31 turned by 90°, so that the positive locking element 31 now is arranged in the second section 20 perpendicular to the insertion direction from the first section 19 into the second section 20. Thereby, a positive locking between positive locking element 31 and opening 12 in the second section 20 is provided, such that a slipping or moving out of the second attachment element 13a via the tapering between first section 19 and second section 20 into the first section 19 is prevented.

The turning of the positive locking element 31 was achieved by a turning of the lever element 33 about the longitudinal axis of the guiding element 14, which is now arranged with its lug 44 in that grooving 43, which e.g. in FIG. 20a was not occupied. The lever element was thus turned by 90°, which in turn realizes a 90° turn of the alignment of the positive locking element 31.

FIG. 20f shows in detail the positive locking by the turned, crosswise alignment of the positive locking element in the second section 20 of the opening 12. The dimensions of the tapering a' are smaller than the diameter b of the crosswise placed positive locking element 31b, which is substantially adapted to the diameter a of the second section 20 of the opening 12, so that an accommodation, substantially free of play, of the positive locking element 31 in an arbitrary orientation in the second section 20 of the opening 12 is realizable.

In FIG. 20g, the lever element was shifted from the end position 46b into the end position 46a. By the longer dimension of the length c' of the end position 46a as compared to the length c of the end position 46b, the guiding element 14 together with the positive locking element 31 as well as the connecting element 30, is pulled in the direction of the lever element 33, so shortening the effective length. Thereby, the contact pressure on contact element 15 is increased, which compresses its contact springs 47 and thus provides a mechanical contact, substantially free of play and vibration-free, which in the following may also be electrically conductive. The position according to FIG. 20g may also be understood as a locked end position for mounting or attaching a component 3a,b,c.

FIG. 20h illustrates said end position from the underside of the attachment structure 1 and shows how the connecting element rests against the underside of the attachment structure 1, while the positive locking element 31 remains in the second section 20 of the opening 12 in a positive locking manner. The surface of the attachment structure 1 adjoining the connecting element 30 may in particular comprise a rough surface or also for example a dampening surface, e.g. a rubber pad.

FIG. 20i shows the same and state seen from the upper side of the attachment structure 1.

Further taking reference to FIGS. 21a and b, different exemplary carrier elements 11 are described. Said carrier elements 11 in each case comprise two second attachment elements 13a as well as two second attachment elements 13b, in each case attached to an ear 28.

Further taking reference to FIG. 22, a conductive connection of component and attachment structure by employing a conductive element according to an exemplary embodiment of the present invention is described.

The component depicted in FIG. 22 corresponds substantially to the components of FIG. 9, wherein first attachment elements 12 according to FIG. 17c as well as a component 3 with second attachment elements 13a according to FIG. 17a are employed.

It is to be noted that the term "comprising" does not exclude other elements or steps and that "a" or "an" does not exclude a plurality. Further, it is to be noted that features or steps, which are described relating to one of the exemplary embodiments of the present invention described above may also be employed in combination with further features or steps of further exemplary embodiments of the present invention described above. Reference numerals in the claims shall not be construed as limiting.

LIST OF REFERENCE NUMERALS 1 attachment structure
2 adapter plate
3a,b,c component
4 aircraft structure
5 attachment system
6 attachment device
7 aircraft cabin
8 V-brackets
9 crown profile
10 longitudinal axis of aircraft/x-axis
11a,b carrier element
12 first attachment element (opening)
13a,b second attachment element
14 guiding element/bolt
15 contact element/spring element
16 locking element/locking spring
17 continuation of locking element
18 recess of guiding element
19 first section of opening
20 second section of opening
21 blind screw connection
22 screw element
23 counter element/nut
24 protrusion/ear
25 conductive element/earth strap
26 center region
27 mounting hole for guiding element
28 latch/ear/protrusion for mounting of the second attachment elements
29 mounting hole for equipment component
30 connecting element
31 positive locking element
32 spring element
33 lever element
34 bolt
35 retaining element
36 groove
37 peg
38 spacing element
39 receptacle for bolt 34
40 opening of the spacing element
41 groovings
42 tapering
43 groovings
44 peg
45 jaw
46a,b,c end position
47 contact springs

The invention claimed is:

1. An attachment device for attaching an equipment component in an aircraft, comprising:
   a first attachment element comprising an opening;
   the opening comprising:
      a first section; and
      a second section;
   wherein the first section is larger than the second section; and
   a second attachment element comprising:
   a guiding element comprising a connecting element and a positive locking element;
   a contact element; and
   a lever locking element;
   wherein the connecting element of the guiding element is adapted to be introduced in the first section of the first attachment element;
   wherein the connecting element of the guiding element is movable from the first section into the second section of the first attachment element;
   wherein the first attachment element and the second attachment element are mechanically couplable by the connecting element, by engaging from behind the first attachment element in the second section of the first attachment element;
   wherein, in a coupled state, the contact element provides a mechanical contact between the first and second attachment elements; and
   wherein, by inserting and rotating the positive locking element within the second section of the first attachment element, the first attachment element and the second attachment element are engaged in a positive locking manner, and
   wherein, by operating the lever element, the first attachment element and the second attachment element are releasably fixed relative to one another.

2. The attachment device according to claim 1, wherein the second attachment element is adapted as a blind screw connection.

3. The attachment device according to claim 1,
   wherein the connecting element is adapted to be introduced into the first section of the first attachment element, and
   wherein the first attachment element and the second attachment element are mechanically couplable by engaging from behind the first attachment element, by employing the connecting element, in the second section of the first attachment element.

4. The attachment device according to claim 1, wherein, in the coupled state, the first attachment element and the second attachment element are electrically connected.

5. The attachment device according to claim 1, further comprising an equipment component comprising a carrier element,
   wherein the second attachment element is connected with the carrier element; and
   wherein the equipment component is releasably attachable to first attachment structure by employing the second attachment element.

6. The attachment device according to claim 5, further comprising:
   at least one second attachment structure;
   wherein the at least one second attachment structure is arranged in a defined distance to the first attachment structure;
   the carrier element further comprising:
   a plurality of the second attachment elements, wherein the plurality of second attachment elements are arranged at the carrier element such that the equipment component is attachable by employing at least two attachment structures.

7. The attachment device according to claim 1,
   wherein, in the coupled state, the component and the attachment device are automatically locked; or
   wherein, in the coupled state, the component and the attachment device are automatically electrically connected.

8. The attachment device according to claim 1, wherein a tapered portion connects the first section to the second section of the first attachment element.

* * * * *